US006700916B1

(12) United States Patent
Kramer et al.

(10) Patent No.: US 6,700,916 B1
(45) Date of Patent: Mar. 2, 2004

(54) E-DIAGNOSTIC, LASER SIMULATOR, AUTOMATED TESTING AND DECONVOLUTION OF SPECTRA FOR LITHOGRAPHIC EXPOSURE RADIATION GENERATING SYSTEMS SUCH AS EXCIMER OR MOLECULAR FLUORINE LASER OR EUV SOURCE SYSTEMS

(75) Inventors: Matthias Kramer, Goettingen (DE); Günter Nowinski, Unterwellenborn (DE); Juergen Kleinschmidt, Weissenfels (DE); Marcus Serwazi, Gleichen (DE)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 10/259,212

(22) Filed: Sep. 26, 2002

Related U.S. Application Data
(60) Provisional application No. 60/325,387, filed on Sep. 26, 2001.

(51) Int. Cl.[7] .................................................. H01S 3/22
(52) U.S. Cl. ........................................................ 372/57
(58) Field of Search ............................................ 372/57

(56) References Cited

U.S. PATENT DOCUMENTS
2001/0020195 A1    9/2001    Patel et al. ................. 700/121

FOREIGN PATENT DOCUMENTS
EP           1 150 401 A2    10/2001    ............. H01S/3/00

Primary Examiner—Leon Scott, Jr.
(74) Attorney, Agent, or Firm—Stallman & Pollock LLP

(57) ABSTRACT

An E-Diagnostic system for monitoring a state of an excimer laser or molecular fluorine laser system includes a processing device and an interface. The processing device runs a program for outputting parameter requests to the laser system, receiving parameter values from the laser system in response to the parameter requests, and storing the parameter values such that a record of the state of the excimer or molecular fluorine laser system is kept. The interface signal-couples the processing device with the laser system permitting the outputting of the parameter requests and the receiving of the parameter values between the processing device and the laser system.

1 Claim, 17 Drawing Sheets

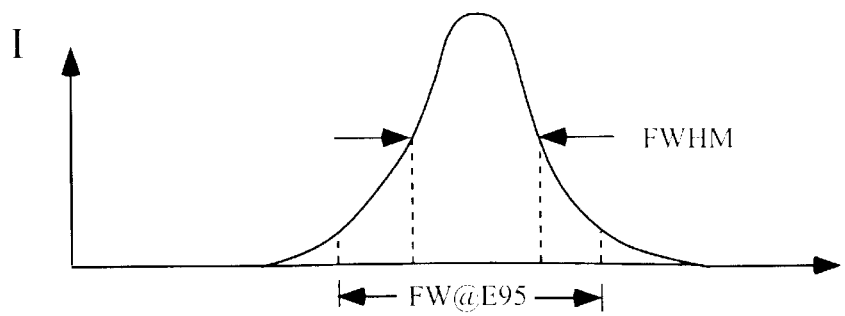
Fig. 16A
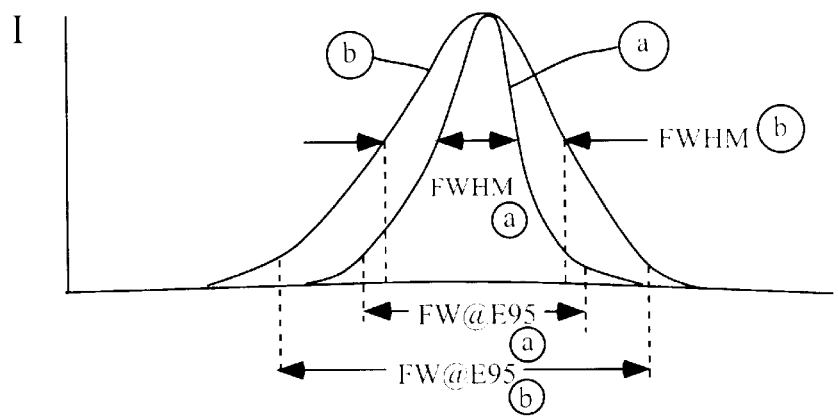
Fig. 16B
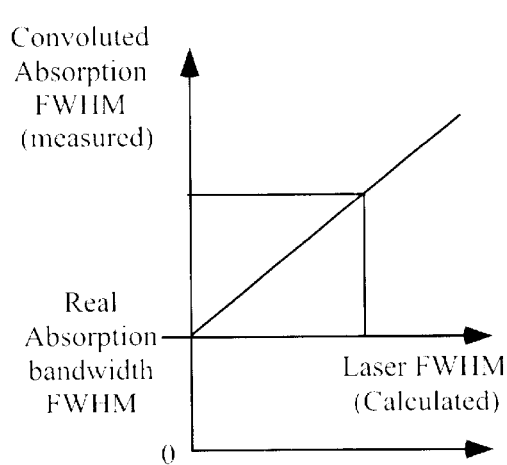 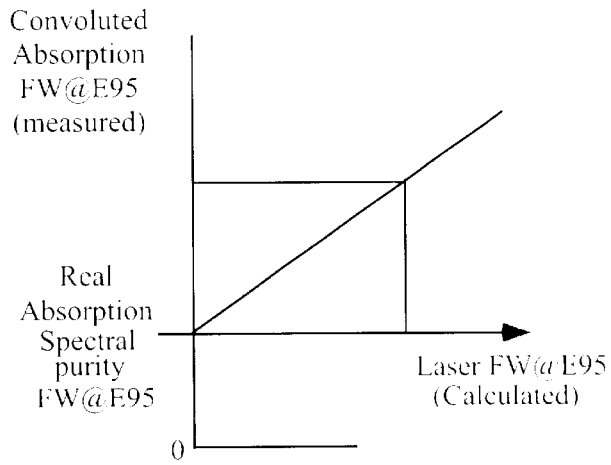
Fig. 16C          Fig. 16D

E-DIAGNOSTIC, LASER SIMULATOR, AUTOMATED TESTING AND DECONVOLUTION OF SPECTRA FOR LITHOGRAPHIC EXPOSURE RADIATION GENERATING SYSTEMS SUCH AS EXCIMER OR MOLECULAR FLUORINE LASER OR EUV SOURCE SYSTEMS

PRIORITY

This application claims the benefit of priority to U.S. provisional patent application No. 60/325,387, filed Sep. 26, 2001, which application is hereby incorporated by reference.

BACKGROUND

1. Field of the Invention

Software control systems and software are described below, and particularly control systems that facilitate exposure radiation control software development for R & D stage exposure sources, increase exposure radiation source system uptimes, provide reliable spectra for monitoring exposure radiation parameters and/or reduce control system software development time and costs.

2. Description of the Related Art

Semiconductor manufacturers are currently using deep ultraviolet (DUV) lithography tools based on KrF-excimer laser systems operating around 248 nm, as well as the following generation of ArF-excimer laser systems operating around 193 nm. Vacuum UV (VUV) will use the $F_2$-laser operating around 157 nm. Extreme UV (EUV) will likely use exposure radiation sources generating radiation beams at wavelength between 11 nm and 15 nm.

The short wavelengths are advantageous for photolithography applications because the critical dimension (CD), which represents the smallest resolvable feature size producible using photolithography, is proportional to the wavelength. This permits smaller and faster microprocessors and larger capacity DRAMs in a smaller package. The high photon energy (i.e., 7.9 eV) is also readily absorbed in high band gap materials like quartz, synthetic quartz ($SiO_2$), Teflon (PTFE), and silicone, among others, such that the excimer and molecular fluorine lasers have great usefulness presently and even greater potential in a wide variety of materials processing applications.

Higher energy, higher stability, and higher efficiency excimer and molecular fluorine lasers are being developed as lithographic exposure tools for producing very small structures as chip manufacturing proceeds into the 0.18 micron regime and beyond. Specific characteristics of laser systems sought to be improved upon particularly for the lithography market include higher repetition rates, increased energy stability and dose control, increased percentage of system uptime, narrower output emission bandwidths, improved wavelength and bandwidth accuracy, and improved compatibility with stepper/scanner imaging systems.

Various components and tasks relating to today's lithography laser systems are increasingly designed to be computer- or processor-controlled. The processors are programmed to receive various inputs from components within the laser system, and to signal those components and others to perform adjustments such as gas mixture replenishment, discharge voltage control, burst control, alignment of resonator optics for energy, linewidth or wavelength adjustments, among others.

Many of the control procedures that the processors of these laser systems are involved in are "feedback" subroutines. That is, a parameter is monitored and the same or a different parameter is controlled by processor commands to system components based on the value of the monitored parameter. Often the processor commands that control the controlled parameter also affect the monitored parameter, they are the same parameter, and thus the feedback subroutines are continuously monitoring and adjusting the system.

It is recognized in the present invention, that there is a difficulty with developing software control programs particularly for feedback subroutines for use with laser systems that are still in the R & D stage and not yet fully operational. That is, input parameters cannot be received by the processor from a fully operational laser system, which is the intended purpose of the feedback control software being developed, until a working laser is actually up and running. At the same time, it presents an undesirable delay in the marketing of new, improved lasers when software development for the processor control of the new lasers is undertaken only after the laser hardware package is otherwise fully developed. It is desired to have a way to develop processor control software for next generation industrial lasers in parallel with the development of the lasers themselves.

Both the chip production processing and the operation of the laser system require some specifically ascribed downtime periods. For the chip processing, maybe the masks or reticles need to be aligned or changed, the substrate sheets changed or the imaging optics adjusted. For the laser system, maybe a new gas fill or partial gas replacement, or scheduled service on the optics or electrical system is required, or beam alignment or wavelength calibration requiring some offline servicing is expected.

The imaging system and/or chip manufacturer typically informs the laser manufacturer what the processing schedule (time schedule for periods of exposure and non-exposure, or uptimes and downtimes) will be for a particular customer order. It is recognized in the present invention that both the laser system and chip processing downtime periods work against the overall goal of maximizing the uptime of the overall system. While some downtime may be unavoidable due to scheduled or unexpected servicing needs of the system, it is desired to have a system where only the minimum amount of downtime is incurred for scheduled servicing of the system.

Each customer who orders a lithography laser system typically supplies a list of commands or command sequences corresponding to various functions required of the laser that are input to the control processor of the laser from an external controller, e.g., at the fab. Each customer typically assigns a different command or command sequence to common functions of the laser system. Software packages including unique laser control modules for each different customer's command/command sequence list are conventionally created consuming a large amount of software development time and cost. In addition, different components of lithography lasers or exposure radiation sources systems may use different software programs and/or protocols or communication hardware and/or software packages. It is desired to reduce software development time and cost, particularly for facilitating communications between monitor computer systems and different components of the laser or exposure radiation systems and/or with different customer stepper/scanner computer systems.

It is important for their respective applications to the field of sub-quarter micron silicon processing that each of the above laser systems become capable of emitting a narrow spectral band of known bandwidth and around a very precisely determined and finely adjustable absolute wavelength. Techniques for reducing bandwidths by special resonator designs to less than 100 pm for use with all-reflective optical imaging systems, and for catadioptric imaging systems to less than 0.6 pm, are being continuously improved upon. Depending on the laser application and imaging system for which the laser is to be used, line-selection and/or line-narrowing techniques are described at U.S. patent applications Ser. Nos. 09/317,695, 09/317,527, 09/130,277, 09/244,554, 09/452,353, 09/602,184, 09/599,130 and 09/629,256, and U.S. Pat. Nos. 5,761,236, 6,081,542, 6,061,382 and 5,946,337, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, all of which are hereby incorporated by reference. Some of the line selection and/or line narrowing techniques set forth in these patents and patent applications may be used in combination.

Techniques are also available for tuning and controlling central wavelengths of emission. Absolute wavelength calibration techniques use a known absorption or emission line around the wavelength of interest as a reference (see U.S. Pat. Nos. 4,905,243, 4,926,428, 5,450,207, 5,373,515, 5,978,391, 5,978,394 and 4,823,354, and F. Babin et al., Opt. Lett., v. 12, p. 486 (1987), and R. B. Green et al., Appl. Phys. Lett., v. 29, p. 727 (1976), as well as U.S. patent applications Ser. Nos. 09/416,344 and 09/271,020 (each application being assigned to the same assignee as the present application), all of the above being hereby incorporated by reference).

Babin et al. discloses using the opto-galvanic effect to determine the KrF-laser absolute emission wavelength. A galvatron having an anode and a cathode is set in the optical path of the laser beam. An Fe vapor fills the galvatron. A voltage is monitored between the cathode and anode. The emission bandwidth of the laser is narrowed and the central wavelength tuned through a range around 248 nm. When the wavelength of the beam impinging the Fe-vapor filled gas volume between the cathode and the anode corresponds to an atomic transition of Fe, a resonance between the levels causes a marked change in voltage between the anode and cathode. Since the absorption lines of Fe are well known and consistent, e.g., based on standards set forth by NIST, the absolute wavelength of the narrowed laser emission band is determinable.

U.S. Pat. No. 4,823,354 to Znotins et al. describes using a photodetector to detect the intensity of light emitted from a KrF-laser. Znotins et al. disclose to use a galvatron having benzene vapor inside, whereas U.S. Pat. No. 5,450,207 to Fomenkov discloses the same technique instead having an Fe cathode inside. The cathode of Fomenkov gives off Fe vapor which fills the galvatron when a current is generated between the cathode and an associated anode. Light emitted from the KrF-laser traverses the gaseous benzene or iron medium of the galvatron before impinging the photodetector. When the wavelength corresponds to an atomic transition of the gas medium of the galvatron, the gas absorbs the light, and the intensity of light detected is reduced. Thus, the absolute wavelength of emission of the KrF-laser is also determinable in this alternative way.

Another known technique uses sealed hollow cathode lamps containing Fe-vapor in a Ne-buffer gas environment. See Hammamatsu Datasheet: Opto-Galvanic Sensor, Galvatron L 2783 Series, Nov. 89, Japan. Thus, the Fe-lamp has become an important and reliable measuring tool for absolute wavelength calibration for KrF-lithography laser systems in the 248 nm spectral region. The '344 application and '391 and '394 patents, mentioned above, describe techniques for absolute wavelength calibration for ArF and $F_2$ lasers.

The '243 patent, also mentioned above, describes the use of a monitor Fabry-Perot etalon to determine relative wavelength shifts away from the known Fe absorption lines, e.g., at 248.3271 nm and 248.4185 nm, among others. To do this, the laser wavelength is first calibrated to the absolute wavelength reference line, e.g., 248.3271 nm, and the laser beam is directed through the etalon. An interferometric image is projected onto a solid state image detector such as a CCD array. Next, the laser wavelength is tuned away from the 248.3271 nm line to a new wavelength. A new image is projected onto the detector, and a comparison with the original image reveals the new wavelength because the free spectral range (FSR) of the monitor etalon is presumably known (e.g., 9.25 pm). For example, if it is desired to tune the laser to 248.3641 nm, then the wavelength would be adjusted 37 pm above the 248.3271 nm Fe vapor absorption line to exactly coincide with four FSRs of the monitor etalon.

A mercury lamp for emitting reference light of known wavelength is used in U.S. Pat. No. 5,748,316. The reference light and the laser beam are each directed to the monitor etalon. A comparison of the fringe patterns produced by the reference light and the laser beam allows a determination of the wavelength of the laser beam relative to that of the reference light.

The demands of laser systems today require very specific determinations of the wavelength shift. Thus, a more precise technique is desired for calibrating the relative wavelength shift.

Other optical characteristics of a laser beam that are desired to know and control are the bandwidth and spectral purity. The bandwidth can be measured as the full width at half maximum (FWHM) of a spectral intensity distribution of a measured laser pulse. The spectral purity is determined as the spectral range within which lies 95% of the energy of the laser pulse.

The bandwidth of a radiation source used, e.g., in photolithographic applications, is constrained by its effect on imaging resolution due to chromatic aberrations in optics of catadioptric imaging systems. The bandwidth of a laser beam can be determined from measuring the widths of fringes produced as the laser beam is passed through a monitor etalon and projected onto a CCD array. A grating spectrometer may also be used and the bandwidth measured in a similar fashion (see U.S. Pat. Nos. 5,081,635 and 4,975,919, each of which is hereby incorporated by reference). It is desired, however, to have a technique for more precisely determining the bandwidth of a laser beam.

SUMMARY OF THE INVENTION

In view of the above, an E-Diagnostic system for monitoring a state of an excimer laser or molecular fluorine laser system is provided including a processing device and an interface. The processing device runs a program for outputting parameter requests to the laser system, receiving parameter values from the laser system in response to the parameter requests, and storing the parameter values such that a record of the state of the excimer or molecular fluorine laser system is kept. The interface signal-couples the processing device with the laser system permitting the outputting of the parameter requests and the receiving of the parameter values between the processing device and the laser system.

A laser simulator is further provided for simulating a behavior of an excimer or molecular fluorine laser system. An algorithm includes a simulation program for simulating parameters received from a running laser and a data collection program for collecting data from a running laser. The simulation and data collection programs provide instructions for reducing the data by correlation analysis and reducing the data by a learning algorithm.

A remote control program running on a computer for automated testing of an excimer or molecular fluorine laser system is also provided. The program includes multiple software modules for remotely controlling the laser system. The multiple modules include an interface and internal programming module and a translation module including at least one of a macro translation module and a script code translation module.

A method and software program for simulating an operating laser system is provided below. The program generates one or more dummy parameters each corresponding to a parameter of an operating laser system. The dummy parameter is read over a same or similar signal interface as the operating laser system by a processor running a test software subroutine having the laser system parameter as an input. An algorithm including the test software subroutine then generates an output command based on the value of the dummy parameter. The dummy parameter is preferably closely estimated to be the value of the laser system parameter to which it corresponds. The algorithm having the laser system parameter as an input may be advantageously developed and tested separately from the operating laser system.

A method and software program for efficiently scheduling laser service routines based on a predetermined lithography system schedule is provided below. A processor reads the lithography system schedule including scheduled system downtimes, wherein the scheduled downtimes include start times and durations. The processor then reads a time window and duration for each of one or more scheduled laser service routines. The processor then determines a start time for each scheduled laser service routine within the time window of the service routine, wherein the start times are selected to collectively maximize temporal overlap of the scheduled laser service routine durations and scheduled system downtime durations. The processor then writes a start time for each scheduled laser service routine.

A software program is provided below including a flow control kernel. A command or command sequence unique to one of multiple external software control programs corresponding to a function of a laser system is read and input to the flow control kernel. The flow control kernel outputs a generic command or command sequence that is the same for each unique input command or command sequence of the multiple external software control programs corresponding to the same laser system function. The generic command or command sequence is then input to a generic control module corresponding to the laser system function. The kernel may include a universal translator or translator table. Advantageously, only one set of generic control modules may be used with all of the multiple external software control programs.

A method is provided for determining the relative wavelength shift of a laser beam away from a known reference line, such as an absorption line of a gas in an opto-galvanic cell or a reference line of a reference laser.

For this method two measuring tools are used. The first one is an atomic absorption spectrometer as described above. The second tool is a spectrometer based on the interferometric generation of a fringe pattern with an etalon, the diameters of the fringes are proportional to the wavelength. Whereas the first tool gives the absolute wavelength of the laser at a discrete set of wavelengths, the second one provides wavelength information with respect to a reference point at any wavelength. A basic parameter of the etalon spectrometer is the spatial distance between the etalon plates. Manufacturers provide this parameter with the accuracy of 1%. Higher accuracy of the spacing and thus higher absolute wavelength accuracy can be achieved from a common wavelength measurement at the discrete set of wavelength known for the first wavemeter. Theoretical calculation of a fit function through the measured data points as shown in FIG. 6 yields the actual etalon plate spacing.

A wavemeter is used, and a monitor etalon is preferably used as the preferred wavemeter device, wherein the FSR of the etalon used to calculate the wavelength shift is determined based on a calculated gap spacing between the etalon plates. The gap spacing is determined based on a fit to measured values of wavelength deviations of the FSR as a function of the relative wavelength shift. The FSR used to calculate the wavelength shift may also be based on the wavelength shift itself. Thus, the wavelength shift of the laser beam is calculated as the number of FSRs counted as the wavelength is tuned from the known reference line, wherein the value of the FSR used in the calculation for each fringe crossed as the wavelength is tuned is calculated based on the calculated gap spacing, and preferably the wavelength shift itself.

A method is provided for measuring the absolute bandwidth of a tunable laser beam using an opto-galvanic or absorption cell. The laser beam is directed to interact with a gas in the cell that undergoes an optical transition within the spectral tuning range of the laser. The beam is tuned through the optical transition line of the gas in the cell, and the opto-galvanic or absorption spectrum of the line is measured. The measured bandwidth is convoluted or broadened by the bandwidth of the laser beam used in the measurement. The bandwidth or spectral purity of the laser beam is determined based on the width of the measured spectrum and a known correspondence between this measured convoluted width and the bandwidth of the laser beam.

Additional apparatuses, software programs and methods are provided below. In particular, E-Diagnostic embodiments, laser simulator embodiments, automated testing embodiments and deconvolution of laser spectra embodiments are provided below.

BRIEF DESCRIPTION OF THE DRAWINGS

FIGS. 16a–16b show lineshapes corresponding to measured laser output pulses.

FIG. 16c shows a dependence of the measured absorption bandwidth FWHM on the laser bandwidth.

FIG. 16d shows a dependence of the measured absorption spectral purity FW@E95 on the spectral purity of the laser beam FW@E95.

INCORPORATION BY REFERENCE

Figure 1:
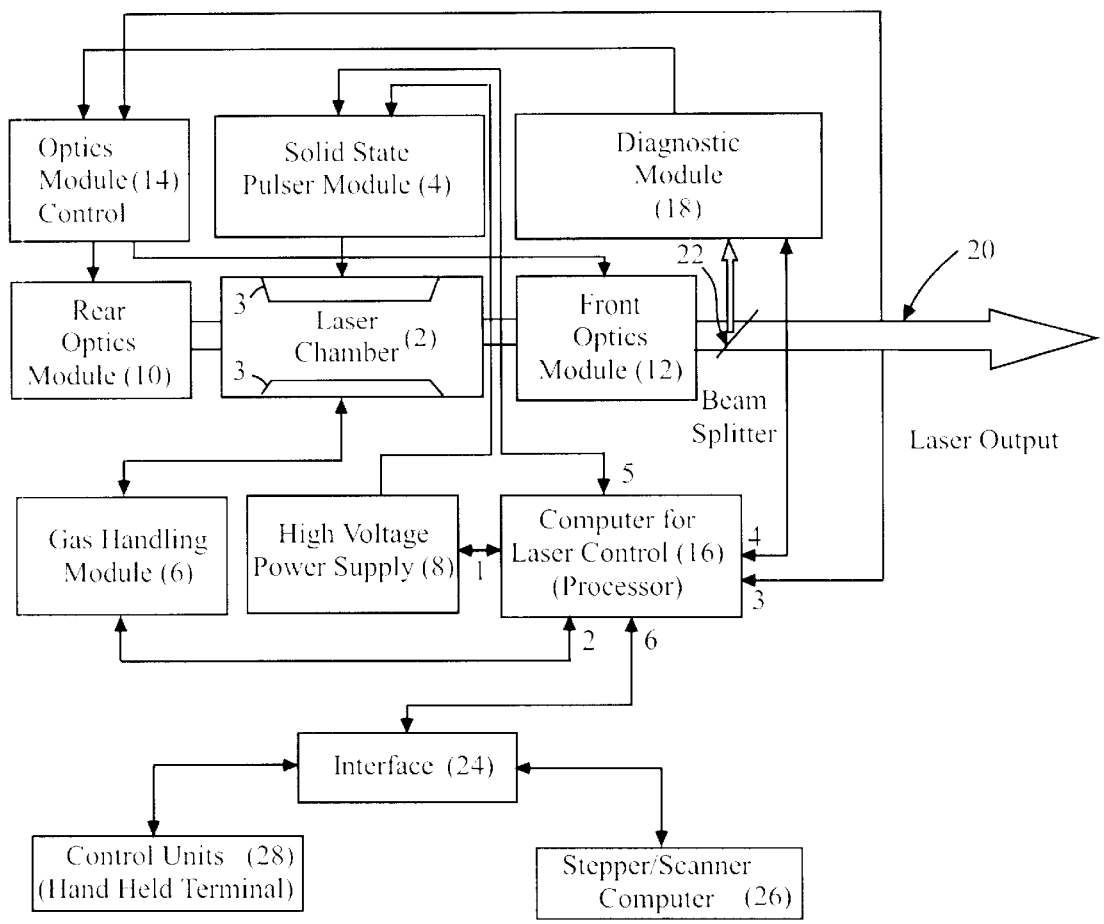
FIG. 1 schematically illustrates an operating excimer or molecular fluorine laser system.

What follows is a cite list of references each of which is, in addition to those references cited above in the priority section, hereby incorporated by reference into the detailed description of the preferred embodiments below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the preferred embodiment with the same effect as just described with respect to the following references:

R. B. Green et al., "Galvanic Detection of Optical Absorptions in a Gas Discharge," Applied Physics Letters, Vol. 29, No.11, pp.727–729, Dec. 1, 1976;

R. Sandstrom, "Argon Fluoride Excimer Laser Source for Sub-0.25 mm Optical Lithography," Optical/Laser Microlithography IV, Vol.1463, pp. 610–616, 1991;

F. Babin et al., "Ultraviolet Optogalvanic Laser Spectroscopy of Iron for Reference Wavelengths," Optics Letters, Vol.12, No. 7, pp. 468–470, July 1987;

P. Camus, "Atomic Spectroscopy with Optogalvanic Detection, Journal De Physique, (Paris) 11C7, pp. C7-87-106, November 1983;

Richard A. Keller et al., "Atlas for optogalvanic wavelength calibration," Applied Optics, Vol.19, No. 6, pp. 836–837, Mar. 15, 1980;

R. A. Keller et al., "Opto-galvanic spectroscopy in a uranium hollow cathode discharge," J. Opt. Soc. Am., Vol. 69, No. 5, pp. 738–742, May 1979;

Norman J. Dovichi, et al., "Use of the optogalvanic effect and the uranium atlas for wavelength calibration of pulsed lasers," Applied Optics, Vol. 21, No. 8, pp. 1468–1473, Apr. 15, 1982;

Masakatsu Okada et al., "Electronic Tuning of Dye Lasers by an Electroooptic Birefringent Fabry-Perot Etalon," Optics Communications, Vol. 14, No. 1, pp. 4–7, 1975; and United States patent applications Ser. Nos. 09/416,344, 09/791,496, 09/741,432, 09/686,483, 09/715,803, 09/741,465, 09/734,459, 09/791,431, and 60/239,686, which are assigned to the same assignee as the present application;

U.S. published patent application Ser. No. US 2001/0020195, published Sep. 6, 2001; and U.S. Pat. Nos. 4,926,428, 5,418,562, 5,978,394, 5,450,207, 4,905,243, 5,978,391, 4,823,354, 4,319,843, 4,911,778, 4,914,662, 5,142,543, 5,198,872, 5,218,421, 5,404,366, 5,764,678, 5,771,094, and 5,025,445.

DETAILED DESCRIPTION OF THE PREFERRED EMBODIMENTS

1. E-Diagnostic

One way of implementing E-Diagnostic to a litho laser machine is to establish a state recording machine outside the laser. For example, a processing device, such as a personal computer or PC, a computer laptop, a palm top or PDA, a central server or another computer system, runs a program which sends periodically parameter requests to the laser. The laser replies by sending one or more values corresponding to the parameter request(s) back to the processing device. These values are stored so that the state of the laser is recorded. The processing device is preferably external to the laser system and is thus independent of the laser operation state. The data generated by this means can be analysed without influencing the performance of the laser. It is of great importance to have data recorded when the laser is given a command by the stepper or an error in the operation of the laser occurs. This kind of data can help analysing problems.

All means and methods described below help improving the operational stability of an external datarecorder program and information content of the data files being generated by that program.

For improving the reliability of data different measures can be taken. First a pattern comparison algorithm could allow the identification of the proper answer. If for example the current energy of a laser is requested, a command "Energy?" will be sent. The answer then could contain the request: "Energy=10". So one way to improve data reliability is to compare both strings and determine if the answer contains the requested parameter. Another way would be the use of checksums added to the strings or data transferred through the interface.

Furthermore a format test will result in higher data security. E.g. it could be defined that an answer to an energy request should by a float number with one digital behind the decimal separator.

A datarecorder program would collect a set of parameter in a periodic cycle and write these parameters into a data file. For a cycle time of 1 s easily data files with sizes bigger than 10 MB will be generated in one day. Evaluation of such big data files sets high requirements to the speed of the computer used. There are different ways to minimize the evaluation time. A very important one is intelligent recording. This means the datarecorder program always evaluates the status of the machine and decides on the number of entries per time interval.

From the viewpoint of the datarecorder program the machine will have three states:

1. High importance state—high temporal resolution of data required
2. Normal state—normal temporal resolution of data required
3. Low importance state—low temporal resolution of data sufficient If for example the machine is in an off state where no interesting actions normally occur the datarecorder could increase the sample interval automatically until an interesting state will be detected again.

To implement this functionality the datarecorder will always request parameters with the lowest sample time, i.e. with the highest temporal density. These data will be stored into a buffer. A decision algorithm then evaluates the importance state of the machine and will add all sets of parameters to the data file, when the high importance state has been detected from the machine and reduce the number of data sets with decreasing importance level of the machine state.

As the software of the machine always will interfere with the parameter requests on an interface, this will lead to non periodic acquisition of parameter sets by the datarecorder. To make one set of parameters complete the datarecorder would have to send several request commands to the machine. It is desired to keep the number of request operations as low as possible. This can be achieved by the definition of a configurable request string. I.e. if for the data recording p1, p2, p5, p7 are of interest, one could define a command telling the machine which parameters should be contained in the answer string of a single parameter request. Example:

CollectPara=p1,p2,p5,p7
CollectPara?→CollectPara=ON,9.99,0.35,2.23
CollectPara=p1,p2,p5,p6,p7
CollectPara?→CollectPara=ON,9.99,0.35,45.3,2.23

A further advantage of achieving all parameters with one request is that these parameters are taken simultaneously. A multiple request of p1?, p2? . . . to the machine would always incorporate a delay due to other activities of the machine and due to the limited protocol speed of the interface.

For getting strictly periodic data of CollectPara the machine software can be programmed to fill a buffer. The conditions for putting a new parameter set into the buffer might be 1. a command or request received from the master machine
2. a new error state of the machine under test
3. a timer interupt By this means an external program would be able to catch states of the machine that are of short duration. Single parts of the buffer will be cleared by requests of the datarecorder.

If the machine itself is controlled by another one it is desired to know the commands and request this master machine gives to the machine under test. For this purpose it is useful to have a request parameter buffering the last command or requests of the master machine to the machine under test.
Example:

MirrorStepper?
MirrorStepper="OPMODE=STEPPER"

The Mirrorparameter may be a buffer or array buffering all commands and requests until they are registered by the datarecorder. MirrorStepper may be added to CollectPara.

Another way of getting the request and commands of the master machine could be to build a splitter into the connection line between the master machine and the machine under test. A simple terminal program could then record the data flowing between the master machine and the machine under test. The terminal program could be a part of the datarecorder.

The datarecorder program can be a separate program or a part of a bigger program controlling the machine under test.

2. Laser Simulator

U.S. patent application Ser. No. 09/741,432 is hereby incorporated by reference in particular respect to this section (see also U.S. published patent application No. US 2001/0020195, published Sep. 6, 2001).

For the testing of Remote Control Software it is desired to have a simulation program, which simulates the behaviour of the machine as good as possible. There are different approaches to solve this problem. One is to define conditions and relations between parameters of the machine. A simulator would incorporate these conditions and relations as algorithms. This kind of simulator is deterministic as it is clear what the answer on a request by the remote control program will be. A random generator or a table of allowed values would help to make such kind of simulator more realistic.

Another approach to establish a simulator is to listen very carefully to a real machine, when it is running. A big database containing all kinds of machine states may be generated by recording all relevant parameters in periodic intervals. As today computers have big memory and very big hard disks, it is possible, to store e.g. 1 million states of a machine on a hard disk of some 10 GB size.

If the machine had n parameters characterizing its state, the state can by represented by a n-dimensional vector. For reduction of data it is important to do correlation analysis:

Are there components of the vector which change proportionally? If yes, a replacement of a parameter by arithmetic relation can be done.

Are there parameters which have control over others (e.g. if the machine is in off-state no energy can be measured). If yes, a replacement of the parameter by algorithmic relation can be done.

Another way to reduce database size is to use learning algorithms. A learning algorithm will adapt new data to the data it already collected and skip it, if it were no new data.

By such means the n-dimensial state vector of the machine and the database can be reduced.

By use of the database the real behaviour of the machine thus can be simulated. For pragmatic reasons a mixture of data base acquisition and predefined relations will be the most efficient way to establish the simulator.

Furthermore such a kind of analysis may help to find logical errors in the programming in the interface (e.g. energy < >0, if machine is in off-state).

3. Automated Testing

Automated testing of electronic machines is done by use of computers. On these computers a software program is running, which is giving the commands to the machine under test and receiving answers from it. The program may be called a "remote control program". For flexible use of these testing algorithms it is desired to implement changes very quickly without going into the environment of a software compiler. Thus it is preferred to split the expertise of the remote control program into three parts: one that helps to interact with the machine by the interface, a second that helps to access internal data of the computer system (e.g. time, date) and a third one interpreting a script or macro code generated by the user. By this means a user can change the machine related code without having to go into a compiler environment.

Automated tests always have the problem to deal with exception states. Under normal condition the machine reacts in an expected manner, but sometimes an error occurs which leads to an interruption of the test procedure. It's complicated to investigate all states of the machine, that might occur and to find a predefined way restoring the status of the machine such that it can continue testing in the same place where it has been interrupted. One way to deal these kind of problems is to lead the remote control program into an "macro exception state". In this state the user has the chance to identify the problem and restore the status of the machine such that it can continue automated testing.

For the detection of an exception state the machine may give an error code itself. Once the automated test algorithm detects an error number unequal zero, it will stop the execution of the program and open an macro exception window. The user is given the decoded name of the error and a field for changing the status of the laser by manual input of remote commands. This handling may be called manual exception handling. The opmode error detection is active with every remote command the macro program sends to the laser machine.

Automated exception handling has to be defined very carefully. In case of a litho laser machine there might be several errors and warnings communicated by the opmode error number to the macro interpreter. Some of these errors are critical for the performance of the laser, others are not. There may be general error handling routines as e.g. switching the laser machine to on, when the laser was switched to off by some reason. There may be specific error handling routines which are to be used for a selected group of errors only.

For getting a database for automated exception handling an automated recording of manual exception actions is helpful.

The concept of automated testing can be extended to more than one machine. If e.g. a variety of measurement and test equipment (MTE) is incorporated into a automated test, a powerful macro language will allow the user to address these MTE components. The interpreter will separate these communication channels by use of functions and procedures. For example a command for a Litho Laser could have the structure Laser("Energy=10")

whereas a command to an Oscilloscope could be Oscilloscope("Timebase=10")

A request could look like

Powermeter("POWER?")

In such a manner all MTE components can be incorporated into the automated test. Requests could be handled as functions, i.e. the answer can be transferred to other parameters directly.

As MTE components have different electronic interfaces (RS232, GPIB, Ethernet, . . . ) and the syntax and commands are different, it is desired to separate these specific problems from the macro interpreter. It is desired to have a server program transferring the requests from the macrointerpreter to the individual MTE components and sending the answer back to the macrointerpreter. The protocol between the Interpreter and the server program should be uniform for every MTE component. The protocol between the server program and the MTE component has to be adapted to the specific set of commands and requests of the MTE component. Standard requests for every MTE component should be an Identity, Status, and Error request. If the command and request set of the MTE component does not allow such commands, the server program by some way has to substitute or compose the answer to give the user a uniform user interface. In this way the server program will provide different levels of commands and request. Command and requests, that can be sent directly to the machine, may be called low level commands and requests. Others may be called high level commands and requests as the server program has to generated the answer by a different way.

It is advantageous to have that server program being connected to the macro interpreter by a TCPIP protocol thus allowing to separate these two programs in an intranet or internet.

4. Deconvolution of Laser Spectra

0. General remarks
1. Determination of Background-Level
2. Determination of Spectral Width at Half Maximum $\Delta\lambda_{HM}$
3. Determination of Spectral Purity $\Delta\lambda_{E95\%}$
4. Determination of Contrast Loss $C_{loss}$
5. Deconvolution of a Measured Laser Spectrum 0. General Remarks An optical spectrum of a laser used for the application with lithography machines is of great importance. The shape and width of the optical spectrum determines amongst other parameters the quality of the output of the lithography machine. Ideally a perfect lithography laser would have an infinitely small bandwidth and no spatial coherence. Reality is different, however. Todays excimer laser used for lithography have significant coherence and a limited bandwidth. Nevertheless these systems compared to other possible solutions (e.g. solid state lasers) are most suitable.

As a typical spectrum of a lithography laser is not infinitely narrow, it is important to measure it. Simple measurements concentrate on the full width at half maximum (FWHM) of the optical spectrum. This measurement can be done with several setups as this value is high above the noise level of a simple optical spectrum.

For measuring integral properties including even small amplitude values of a spectrum, more sophisticated spectrometers are required. Typically grating spectrometers with a long beam path of some meters and highly sensitive CCD-Cameras or Line-Sensors or photomultipliers are used. For a good resolution of the foot structure of a spectrum a dynamic range of 12 bit minimum is necessary.

The dispersion d is an indicator for the power of the spectrometer. It is wavelength dependent and is specified in units of [fm/pixel]. d should be lower than the spectral resolution limited by diffraction or slit width. State of the art spectrometers achieve 20 fm/pixel at 248 nm and 15 fm/pixel at 193 nm.

For the evaluation of a spectrum it has to fulfill certain requirements. First the maximum amplitude has to be far above noise to evaluate parameters like spectral purity. Second the wavelength peak has to be centered with respect to the center of the camera sensor or the evaluation range. Third background correction has to be done carefully to not include noise structures into every measurement. In general the length of the sensor has to be so long that the signal on both sides of the wavelength peak is much smaller than the noise level.

1. Determination of Background-level

When evaluating laser spectra in the range of 1% of maximum amplitude, the determination of the background level is very important. Although a good spectrometer offers the opportunity of dark correction, i.e. by taking a spectrum without any laser light and subtracting it from every measured picture, there will be always additional background when measuring a spectrum. This part of background is caused by scattering at all optical surfaces in the spectrometer and by baseline drift of the camera sensor. For evaluation one assumes this additional background level to be constant over the whole camera sensor.

With x as the pixel number a given spectrum M(x), which has been dark corrected, is evaluated by the following algorithm:

Calculate a moving average over 2n+1 values:

$$M'(x) = \frac{1}{2n+1} \sum_{i=-n}^{+n} M(x+i), x = x_{\min} + n \ldots x_{\max} - n$$

Typical values are $x_{min}=1$, $_{max}$=number of pixels of camera, n=11.

Determine $x_0$ where M'(x) is maximum:

$$x_0 = \{x_a : M'(x_a) = \max\{M'(x), x = x_{min} + n \ldots x_{max} - n\}\}$$

Determine minimum of M' left and right side of maximum of M' and Maximum of M:

$$x_{left} = \min\{x_a : M'(x_a) = \min\{M'(x), x = x_{min} + n \ldots x_0\}\}$$

$$x_{right} = \min\{x_a : M'(x_a) = \min\{M'(x), x = x_0 \ldots x_{max} - n\}\}$$

$$M_{max} = \max\{M(x), x = x_{min} \ldots x_{max}\}$$

Rescale M(x) by background subtraction and normalization to $M_N(x)$:

$$M_N(x) = \frac{M(x) - \frac{1}{2}(M'(x_{left}) + M'(x_{right}))}{M_{max} - \frac{1}{2}(M'(x_{left}) + M'(x_{right}))}, \quad x = x_{min} \ldots x_{max}$$

Remarks:
  Laser spectra from a resonator with an intracavity etalon sometimes have sidemodes which may be at the border of the measured spectral range. For this reason background calculation has to be done by using a moving average which might yield minimum value even closer to center of the spectrum.
  For convenience of evaluation all data points are shifted by the difference of center of gravity of the spectrum and the middle point of the data array. By this means every spectrum has its center of gravity at the same x-position.

$$x_1 = \{x : M_N(x) < \frac{1}{2} \leq M_N(x+1)\}$$

$$x_2 = \{x : M_N(x) < \frac{1}{2} \leq M_N(x-1)\}$$

2. Determination of Spectral Width at Half Maximum $\Delta\lambda_{HM}$

The determination of $\Delta\lambda_{HM}$ is uncritical, as this quantity is far above noise level. One can calculate $\Delta\lambda_{HM}$ by interpolation to achieve subpixel accuracy.

Follow background correction and normalization in section 1.

Determine half maximum points of M left and right side of maximum of M:

$$C = \frac{\frac{1}{2} - M_N(x_1)}{M_N(x_1 + 1) - M_N(x_1)} + \frac{\frac{1}{2} - M_N(x_2)}{M_N(x_2 - 1) - M_N(x_2)}$$

Calculate Full Width at Half Maximum:

$$\Delta\lambda_{HM} = [x_2 - x_1 - C]d$$

where d is the dispersion of the camera sensor (given in units of [pm/pixel]) and Correction term C comes from linear interpolation 3. Determination of Spectral Purity $\Delta\lambda_{E95\%}$ The spectral purity defines the wavelength interval of a spectrum which includes 95% of the integral energy. Spectral purity is an indicator for the lineshape of the spectrum. A purely gaussian spectrum with a full width at half maximum of $\Delta\lambda_{HM}$ has a spectral purity of $\Delta\lambda_{E95\%, Gauss} = 1.66 \times \Delta\lambda_{HM}$, whereas for a purely lorenzian spectrum the relation is $\Delta\lambda_{E95\%, Lorenz} \approx 12 \times \Delta\lambda_{HM}$. These relations are valid for an infinite range of data points only. As soon as the spectrum is limited by the sensor length, the factors decrease.

For the evaluation the range measured in [pm] is limited to ± a with respect to the center of the spectral peak. By limiting the evaluation range the influence of noise on the result is reduced. Therefor for KrF it has been defined that a is 5 pm. The spectral purity of a spectrum M(x) is calculated by the following steps:

Determine and subtract background following section 1.

Calculate position of maximum:

$$x_0 = \{x : M_N(x) = 1\}$$

Determine evaluation range:

$$x_{min} = x_0 - \text{round}(a/d)$$

$$x_{max} = x_0 + \text{round}(a/d)$$

Calculate the integral $M_{int}$ of $M_N(x)$:

$$M_{Int.} = \sum_{x=x_{min}}^{x_{max}} M_N(x)$$

Calculate the first moment $M_{1\cdot Mom}$ of $M_N(x)$:

$$M_{1 \cdot Mom.} = \sum_{x=x_{min}}^{x_{max}} [x M_N(x)]$$

Calculate the center of gravity $x_{CG}$ of $M_N(x)$ as an integer number:

$$x_{CG} = \text{round}\left(\frac{M_{1 \cdot Mom.}}{M_{Int.}}\right)$$

Determine the spectral purity $\Delta x_{E95\%}$ or $\Delta\lambda E95\%$:

$$\Delta x_{E95\%} = \min\left\{\Delta x : \sum_{x=x_{CG} - \Delta x/2}^{x_{CG} + \Delta x/2} \frac{M_N(x)}{M_{int.}} \geq 95\%\right\}$$

$$\Delta\lambda_{E95\%} = d\Delta x_{E95\%}$$

Remarks:
  Again interpolation is done to achieve the exact value of $\Delta\lambda_{E95\%}$ An alternative approach is the determination of 2.5%- and 97.5%-margin:

$$x_{E2.5\%} = \min\left\{x_a: \sum_{x=x_{min}}^{x_{min}+x_a} \frac{M_N(x)}{M_{Int.}} \geq 2.5\%\right\}$$

$$x_{E97.5\%} = \min\left\{x_b: \sum_{x=x_{min}}^{x_{min}+x_b} \frac{M_N(x)}{M_{Int.}} \geq 97.5\%\right\}$$

$$\Delta x_{E95\%} = x_{E97.5\%} - x_{E2.5\%}$$

In general results from 2.5%/97.5%-margin calculation are slightly higher than results from center of gravity calculation.

The spectral purity is very sensitive to the determination of the background level. A first estimate for the accuracy of background determination $\Delta M$ is the reciprocal of the signal to noise ratio SNR. The signal to noise ratio can be defined by the following formulae $$S_{left} = Stdev(M(x), x = x_{left} - n \ldots x_{left} + n)$$

$$S_{right} = Stdev(M(x), x = x_{right} - n \ldots x_{right} + n)$$

$$SNR = \frac{1}{\frac{1}{2}(S_{left} + S_{right})}$$

where $x_{left}$ and $x_{right}$ are minimum points left and right side of maximum of the moving average M'(x) (see background determination in section 1). Stdev indicates the standard deviation.

4. Determination of Contrast Loss $C_{Loss}$

Contrast Loss is a new way to specify the quality of a laser spectrum in conjunction with a given normalized contrast function of a stepper or scanner. Contrast loss $C_{Loss}$ compares the contrast in the illumination area of the stepper of a ultranarrowband light source (ideal laser) with a narrowband source (real laser). Through the narrowband laser the contrast function cf(x) becomes a modified contrast function cf'(x) which is the convolution integral of cf(x) and the laser spectrum. The contrast function is a calculated curve and is determined by the stepper or scanner only.

For a given laser spectrum $M_N(x)$, contrast loss is calculated by $$M_{Int.} = \sum_{x=x_{min}}^{x_{max}} M_N(x) \to cf'(x') = \sum_{x=x_{min}}^{x_{max}} M_N(x)cf(x'-x)/M_{Int.}$$

$$C_{Loss} = cf(x'=0) - cf'(x'=0) = 1 - \sum_{x=x_{min}}^{x_{max}} M_N(x)cf(x)/M_{Int.}$$

Remarks:
  Again evaluation range $x_{min} \ldots x_{max}$ is limited similar to section 3.
  Contrast loss per definition depends on the contrast function and thus is not a parameter of the laser spectrum itself. Another stepper or scanner would yield another contrast loss. So $\Delta\lambda_{HM}$ and $\Delta\lambda_{E95\%}$ should always be noted as well.
  Similar to Spectral purity Contrast loss depends on the determination of the background level. The same error analysis as for Spectral purity can be done here.

5. Deconvolution (1)

Every measured laser spectrum is influenced by the properties of the spectrometer. The mathematical way to describe this is the convolution of the system function and the real laser spectrum. Through convolution all spectral parameters like Spectral Width at Half Maximum $\Delta\lambda_{HM}$, Spectral Purity $\Delta\lambda_{E95\%}$ and Contrast Loss $C_{loss}$ are increased significantly. By the inverse process called deconvolution the real laser spectrum can be reconstructed and the real spectral parameters can be calculated. For this algorithm the system function of the spectrometer (also called slit function for grating spectrometers) has to be known. The System function has to be measured with an ultimately narrow laser only once. One approach to solve the deconvolution problem is the following:

We calculate the convolution of an assumed real laser spectrum R(x) with the $$C(x') = \sum_{x=x_{min}}^{x_{max}} S(x)R(x'-x)$$

system function S(x) and achieve a first convoluted spectrum C(x):

If M(x) is the measured spectrum, the difference function D(x) is given by $$D(x) = M_N(x) - C(x)$$

An error signal $Err_{Deconv.}$ is derived from the sum of squared differences of C(x) and M(x):

$$Err_{Deconv.} = \sum_{x=x_{min}}^{x_{max}} [M_N(x) - C(x)]^2 = \sum_{x=x_{min}}^{x_{max}} D(x)^2$$

By the shape of the difference function D(x) parameters of R(x) are selected which are optimized with respect to the deconvolution error $Err_{Deconv.}$ in the next step. This procedure continues until relative decrease of $Err_{Deconv.}$ from one iteration to the next is less than 10%. The optimization can be done by an arbitray optimization program.

A first indicator for a good deconvolution is an agreement of $\Delta\lambda_{HM}$ for C(x) and M(x). A better indicator is the agreement of $\Delta\lambda_{E95\%}$ for C(x) and M(x). The best indicator is a small deconvolution error $Err_{Deconv.}$ A good estimate for real laser spectra is a sum of half side gaussian and lorenzian functions:

$$Lorenz_{left}(x, a, c, w) = \begin{cases} \dfrac{a}{1+\left(\frac{x-c}{w}\right)^2}, & x \leq 0 \\ 0, & x > 0 \end{cases}$$

$$Lorenz_{right}(x, a, c, w) = \begin{cases} 0, & x \leq 0 \\ \dfrac{a}{1+\left(\frac{x-c}{w}\right)^2}, & x > 0 \end{cases}$$

$$Gauss_{left}(x, a, c, w) = \begin{cases} ae^{-4\ln 2\left(\frac{x-c}{w}\right)^2}, & x \leq 0 \\ 0, & x > 0 \end{cases}$$

$$Gauss_{right}(x, a, c, w) = \begin{cases} 0, & x \geq 0 \\ ae^{-4\ln 2\left(\frac{x-c}{w}\right)^2}, & x < 0 \end{cases}$$

where a indicates the amplitude, c the center and w the width of the function. In this form w is the full width at half maximum for all functions.

So R(x) is given by $$R(x) = \text{Gauss}_{left}(x, a_1, w_1, c) + \text{Gauss}_{right}(x, a_2, w_2, c)$$
$$+ \text{Lorenz}_{left}(x, a_3, w_3, C) + \text{Lorenz}_{right}(x, a_4, w_4, C)$$
$$+ \text{Gauss}_{left}(x, a_5, w_5, c) + \text{Gauss}_{right}(x, a_6, w_6, c)$$
$$+ \text{Lorenz}_{left}(x, a_7, w_7, c) + \text{Lorenz}_{right}(x, a_8, w_8, c)$$

The first two lines contain the "center functions" which start in the optimization procedure with a lower width, whereas the last two lines contain the "wing functions" with a broader width.

The following constrictions limit the number and range of fitting parameters:
(1) $0 \leq a_i \leq 1$, i=1 . . . 4
(2) $0 < w_i$, i=1 . . . 8
(3) $a_3 = 1 - a_1$
(4) $a_4 = 1 - a_2$
(5) $0 \leq a_i \leq 0.1$, i=5 . . . 8
(6) $a_8 = a_5 + a_7 - a_6$ To our experience laser spectra from a resonator having a grating and prisms as dispersive elements can be fitted without the wing functions, i.e. a5 . . . a8=0.

Remarks:
The number of mathematical operations for a single convolution is $x_{max}^2$. To reduce this number the system function is set to zero outside the interval $[x_0-b, x_0+b]$, where $x_0$ is the pixel position of the center of the spectral peak and b is the evaluation range for deconvolution. We set $b = 10 \Delta \lambda_{HM}/d$.

6. Deconvolution (2)

Another iterative algorithm may be used for deconvolution:

We set the difference function D(x)=0 for all x in $[x_{min}, x_{max}]$ and set the first estimate of a real spectrum identical to the measured one: $R(x)=M_N(x)$ for all x in $[x_{min}, x_{max}]$.

Next the convolution C(x) of R(x)+D(x) with S(x) is calculated. For the first convolution D(x) will have no influence as it is identical to zero.

For preparation of the next iteration D(x) is calculated as the difference between $M_N(x)$ and C(x).

A next convolution is done and the resulting function C(x) as a consequence of theoretical limit converges with further iterations to the measured spectrum.

Special filters help to avoid noisy spectra.

7. Deconvolution (3)

Another approach to estimate the spectral properties of a deconvoluted spetrum from the system function and the measured spectrum is to extrapolate the interesting parameters from several convoluted spectra. So the algorithm woud be:

Determine all interesting parameters from the measured spectrum $M_N(x)$ (=$C_0(x)$).

Calculate the first convoluted spectrum $C_1(x)$ by convolution of $M_N(x)$ with S(x)

Determine all interesting parameters from the calculated spectrum $C_1(x)$.

Repeat the last two steps p times

Now plot all interesting parameters of $C_1$ to $C_p$ into a diagram.

In the last step calculate the spectral properties of the wanted deconvoluted spectrum by using optimized polynomial backward extrapolation of their corresponding parameters in $C_1$ to $C_p$.

By this method no spectrum is achieved, but the interesting parameters can be extracted without a big mathematical effort.

8. Laser Software Control Systems

FIG. 1 schematically shows a laser system in accord with a preferred embodiment. The system includes a laser chamber 2 filled with a gas mixture and having a pair of main electrodes 3 and one or more preionization electrodes (not shown). The electrodes 3 are connected to a solid-state pulser module 4. A gas handling module 6 is connected to the laser chamber 2. A high voltage power supply 8 is connected to the pulser module 4. A laser resonator is shown including the laser chamber 2 and a rear optics module 10 and a front optics module 12. An optics control module 14 communicates with the rear and front optics modules 10, 12. A computer or processor 16 controls various aspects of the laser system. A diagnostic module 18 receives a portion of the output beam 20 from a beam splitter 22.

The gas mixture in the laser chamber 2 typically includes about 0.1% $F_2$, 1.0% Kr and 98.8% Ne for a KrF-laser, 0.1% $F_2$, 1.0% Kr and 98.8% Ne and/or He for an ArF laser, and 0.1% $F_2$ and 99.9% Ne and/or He for a $F_2$ laser (for more details on the preferred gas mixtures, see U.S. Pat. Nos. 4,393,505, 4,977,573 and 6,157,162 and U.S. patent applications Ser. Nos. 09/447,882, 09/418,052, 09/688,561, 09/416,344, 09/379,034, 09/484,818 and 09/513,025, which are assigned to the same assignee as the present application and are hereby incorporated by reference). The laser system may be another gas discharge laser such as a KrCl, XeCl or XeF excimer laser. A trace amount of a gas additive such as xenon, argon or krypton may be included (see the '025 application, mentioned above).

One or more beam parameters indicative of the fluorine concentration in the gas mixture, which is subject to depletion, may be monitored, and the gas supply replenished accordingly (see the applications mentioned above). The diagnostic module 18 may include the appropriate monitoring equipment or a detector may be positioned to receive a beam portion split off from within the laser resonator (see the '052 application). The processor 16 preferably receives information from the diagnostic module 18 concerning the halogen concentration and initiates gas replenishment action such as micro-halogen injections, mini and partial gas replacements, and pressure adjustments by communicating with the gas handling module 6.

Although not shown, the gas handling module 6 has a series of valves connected to gas containers external to the laser system. The gas handling module 6 may also include an internal gas supply such as a halogen and/or xenon supply or generator (see the '025 application). A gas compartment (not shown) may be included in the gas handling module 6 for precise control of the micro halogen injections (see the '882 application, mentioned above, and U.S. Pat. No. 5,396,514, which is assigned to the same assignee as the present application and is hereby incorporated by reference).

The wavelength and bandwidth of the output beam 20 are also preferably monitored and controlled. Preferred wavelength calibration apparatuses and procedures are described at U.S. Pat. Nos. 6,160,832 and 6,160,831, which are hereby incorporated by reference. The monitoring equipment may be included in the diagnostic module 18 or the system may be configured to outcouple a beam portion elsewhere such as from the rear optics module 10, since only a small intensity beam portion is typically used for wavelength calibration (see the '344 application).

Preferred main electrodes 3 are described at U.S. patent application Ser. No. 09/453,670, which is assigned to the same assignee as the present application and is hereby incorporated by reference. Other electrode configurations are set forth at U.S. Pat. Nos. 5,729,565 and 4,860,300, which are hereby incorporated by reference. Preferred preionization units are set forth at U.S. patent applications Ser. Nos. 09/692,265 and 09/247,887, which are assigned to the same assignee as the present application and are hereby incorporated by reference. The preferred solid state pulser module 4 and the high voltage power supply 8 are set forth at U.S. Pat. Nos. 6,020,723 and 6,005,880 and U.S. patent application Ser. No. 09/640,595, which are assigned to the same assignee as the present application and are hereby incorporated by reference into the present application.

The resonator includes optics for line-narrowing and/or line-selection and also preferably for further narrowing the selected line. Many variations are possible For this purpose, those shown in U.S. Pat. Nos. 4,399,540, 4,905,243, 5,226,050, 5,559,816, 5,659,419, 5,663,973, 5,761,236, 6.081,542, 6,061,382, and 5,946,337, and U.S. patent applications Ser. Nos. 09/317,695, 09/130,277, 09/244,554, 09/317,527, 09/073,070, 09/452,353, 09/602,184, 09/629,256, 09/599,130, 60/170,342, 60/172,749, 60/178,620, 60/173,993, 60/166,277, 60/166,967, 60/167,835, 60/170,919, 60/186,096, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application. Some of the line selection and/or line narrowing techniques set forth in these patents and patent applications may be used in combination.

The processor 16 is also shown connected to an interface 24. The interface 24 allows the processor 16 to communicate with a stepper/scanner computer 26 associated with the imaging system. The interface 24 also allows the processor 16 to communicate with control units 28 at a hand held terminal, also associated with the imaging system or otherwise at the fab.

As shown in FIG. 1, the processor 16 receives various inputs at interfaces labeled 1–6. The processor 16 may receive many other inputs and may not receive all of the inputs at interfaces 1–6 as shown depending on the configurational specifications of the laser system. In addition, some of the modules may communicate directly with each other, e.g., some of the modules may be configured with their own microprocessors. The processor shown at FIG. 1 is limited to receiving inputs at interfaces 1–6 for the purposes of illustrating the advantages of the preferred embodiment.

Input at interface 1 to the processor 16 is received from the power supply 8. Input at interface 2 is received from the gas handling module 6. Input at interface 3 is received from the optics control module 14. Input at interface 4 is received from the diagnostic module 18. Input at interface 5 is received from the pulser module 4. Input at interface 6 is received from the interface 24 connected to the stepper/scanner computer 26 and control units 28 of the fab.

During operation of the laser system shown at FIG. 1, the processor 16 receives the inputs at interfaces 1–6 and sends control signals out to various modules based on the inputs received at interfaces 1–6. The processor 16 may send signals out to the power supply 8 through interface 1, to the gas handling module 6 through interface 2, to the optics control module 14 through interface 3, to the diagnostic module 18 through interface 4, to the pulser module 4 through interface 5, and to the interface 24 through interface 6. In this way, the processor 16 monitors and controls various modules of the laser system.

As stated above, a problem arises when there is no laser system available to receive inputs through interfaces 1–6, even though it is desired to test and run software for controlling the processor 16. The problem may arise when the laser system is still under development, or when an operating laser system that has been developed is simply not available for connecting the processor 16 through the various interfaces 1–6 to the various modules of the laser system, as shown in FIG. 1.

Figure 2:
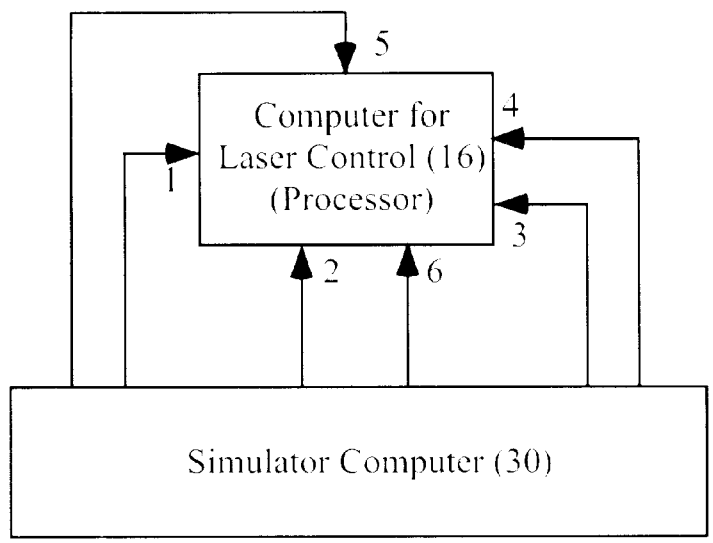
FIG. 2 schematically illustrates a laser control computer connected to a second computer running laser simulation software in accord with a first embodiment.

FIG. 2 shows a processor 16 connected to a simulation computer 30 through the same interfaces 1–6 shown and described at FIG. 1. The simulator computer 30 is configured for and is connected to the processor 16 through interfaces 1–6, just as the various component modules of the laser system would be connected in accord with FIG. 1. As far as the processor 16 is concerned, the processor 16 is connected at the same interfaces 1–6 as it would be if it were connected into a fully operational laser system, such as that schematically shown at FIG. 1.

The simulator computer 30 is equipped with software including a software program for simulating an operating laser system, such as the one schematically shown at FIG. 1, in accord with the first aspect of the invention. The simulator program generates one or more dummy parameters each corresponding to a parameter of the operating laser system. The dummy parameters are sent to the processor 16 from the simulator computer 30 over the same interfaces 1–6 that the component modules of the laser system of FIG. 1 would if the processor 16 were connected thereto. The dummy parameters are received and read by the processor 16 which is running a test software subroutine having the laser system parameters corresponding to the dummy parameters as inputs. As such, the dummy parameters have preferably the same or similar values as the laser system parameters that the component modules of the laser system would send to the processor 16, again if the processor 16 were connected in the laser system according to FIG. 1.

The software loaded on the processor 16 processes the dummy parameters just as the processor 16 would process corresponding laser system parameters. The processor 16 then generates and sends output commands based on the values of the dummy parameters through the interfaces 1–6 to the simulator computer 30. The simulator computer 30 is preferably equipped to receive, store and/or display the generated output commands and/or the effect on a simulated laser system that the output commands would have just as if the output commands were issued to the various modules of an operating laser system. The algorithm having the laser system parameter as an input may be advantageously developed and tested separately from the operating laser system.

Figure 3:
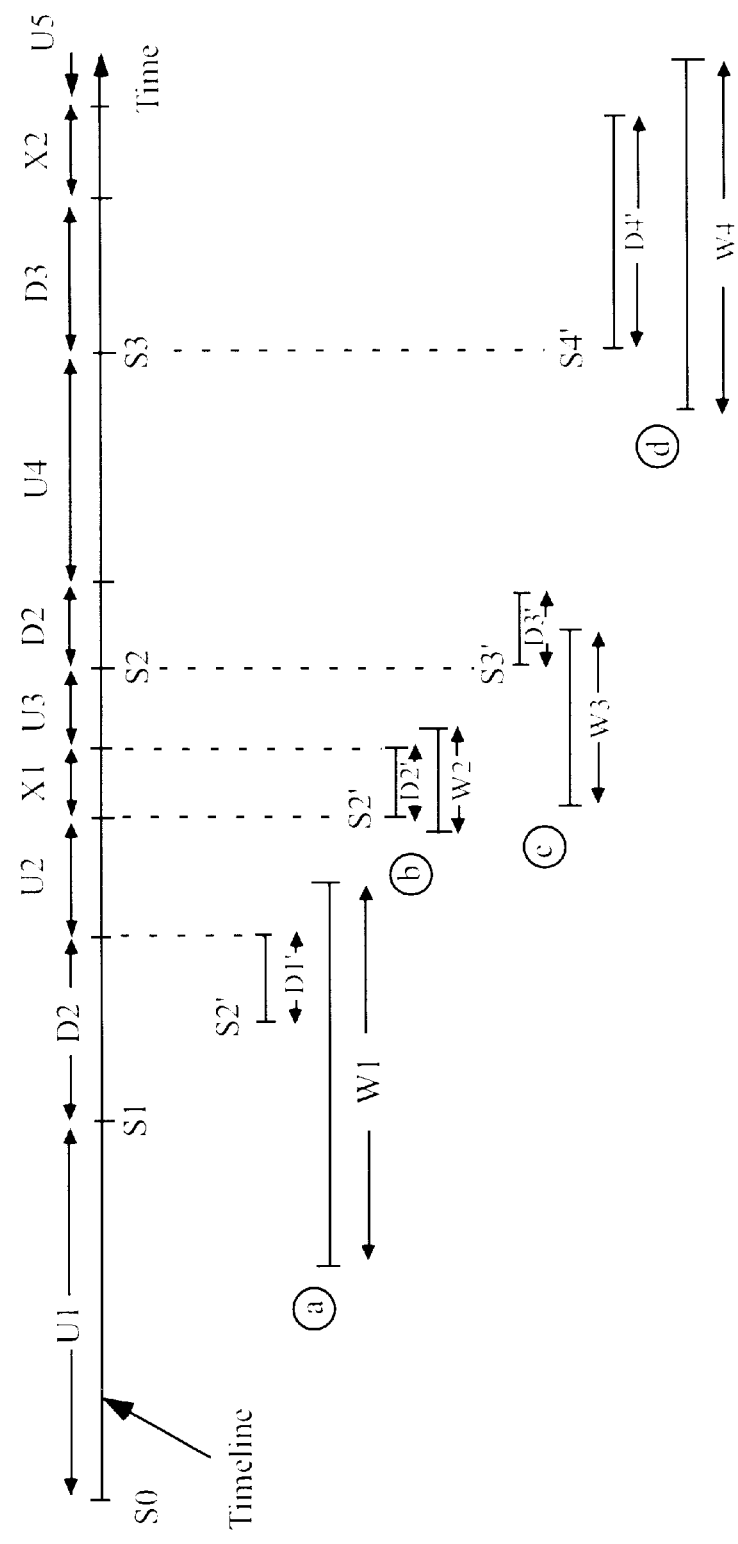
FIG. 3 illustrates a laser service routine schedule written to minimize lithography system downtime in accord with a second embodiment.

FIG. 3 illustrates a second embodiment wherein a laser service routine schedule is written to minimize lithography system downtime. A timeline is shown depicting various time durations including lithography system uptimes U1–U5, and downtimes D1–D3 and X1–X2. The timeline also shows the start times S1–S3 of the downtimes D1–D3, and the start time S0 of the lithography processing. The timeline is a continuously running time from the start time S0 representing the start of lithography processing, e.g., with a new project. Each of the times U1–U5, D1–D3 and X1–X2 along the timeline represent durations of time during the ongoing lithography processing according to states of the processing. The various durations depicted in FIG. 3 are not drawn to a realistic scale and are only depicted to illustrate this embodiment.

The uptimes U1–U5 represent time durations when chips are actually being exposed by the laser. The downtimes D1–D3 and X1–X2 represent time durations when chips are not being exposed by the laser. The downtimes D1–D3 are scheduled downtimes of the lithography system not having to do with scheduled service of the laser system, and are determined at the fab. As mentioned above, the timeline including including the uptimes U1–U5 and the downtimes D1–D3 are communicated to personnel associated with the laser system in advance by personnel at the fab or otherwise associated with the lithography system. The downtimes X1–X2 are imposed on the lithography system due to unavoidable scheduled servicing of the laser system that could not be scheduled during scheduled downtimes D1–D3 of the lithography system.

Scheduled laser service routines are depicted as labeled (a)–(d) in FIG. 3. These scheduled laser service routines are temporally located to correspond to times along the timeline when laser service routines are to be performed. The durations W1–W4 are windows of time anywhere within which the scheduled service associated with the laser service routines (a)–(d), respectively, could be started. The durations D1'–D4' are the temporal durations of the scheduled laser service routines (a)–(d), respectively, or the time it takes to perform the scheduled laser service routines (a)–(d). The windows W1–W4 and the durations D1'–D4' are set in advance and are constraints on the real laser system (ideally they would not exist).

Each of the lithography system uptimes U1–U5, the downtimes D1–D3 of the lithography system not having to do with scheduled service of the laser system, the windows W1–W4 and the durations D1'–D4' are inputs to a processor running a computer program in accord with the second aspect of the invention. The program computes the start times S1'–S4' according to its programming. The windows W1–W4 and the durations D1'–D4' may be adjustable depending on their relative values, and the program takes that into consideration in its determination of the start times S1'–S4'. The start times S1'–S4' are advantageously determined by the program such that the downtimes (i.e., X1, X2, etc.) associated with scheduled service of the laser system that could not be scheduled during lithography system downtimes D1–D3 are minimized. It follows that the overall uptime of the lithography system (i.e., U1+U2+U3+U4) is advantageously maximized along the entire timeline shown in FIG. 3.

The scheduled service routine (a) is advantageously scheduled to overlap entirely within the scheduled lithography system downtime D1. In this case, there is no downtime incurred due to the laser system service routine (a). The scheduled service routine (a) shows the start time S1' being set such that the scheduled service of the laser system is finished right about or just before the time the lithography system downtime D1 is ended and the lithography system is previously scheduled to be brought back up. The position of the start time S1' and thus the laser service duration D1' of the laser service routine (a) within the lithography system downtime duration D1 in this case may have been determined based on how other windows Wi may adjust depending on when the service routine (a) is completed. Again, the total schedule is set to minimize the total downtime incurred by the overall system due solely to scheduled laser system servicing.

The scheduled service routine (b) is unavoidably scheduled within a previously scheduled uptime of the lithography system. The program determined that there was no scheduled lithography system downtime D1–D3 within which the laser service routine (b) could have been performed. The start time S2' was nonetheless selected based on how future windows Wi and start times Si' would be affected by its positioning along the timeline to maximize total uptime of the system.

The third laser service subroutine (c) is, like routine (a), advantageously entirely overlapped with lithography system downtime D2. The duration D3' extends beyond the window W3, but the start time S3' is within the window W3, which is all that is required regarding the positioning of the duration D3' relative to the window W3, beyond minimizing the downtimes Xi.

The fourth laser service routine (d) shown in FIG. 3 overlaps the entire system downtime D3, as the start time S3 of the downtime D3 is at the start time S4' of the laser service duration D4'. However, the duration D4' is longer than the duration D3, and so downtime X2 was unavoidable. However, the selection of the start time S4' at the start time S3 rather than after S3 resulted in a shorter downtime X1. The start time S4' was not selected to be earlier than S3 because the overall sum of downtimes Xi was minimized by selecting that start time S4', even though setting S4' somewhat earlier time would not have reduced the overall downtime Xi associated directly to the laser service routine (d).

Figure 4:
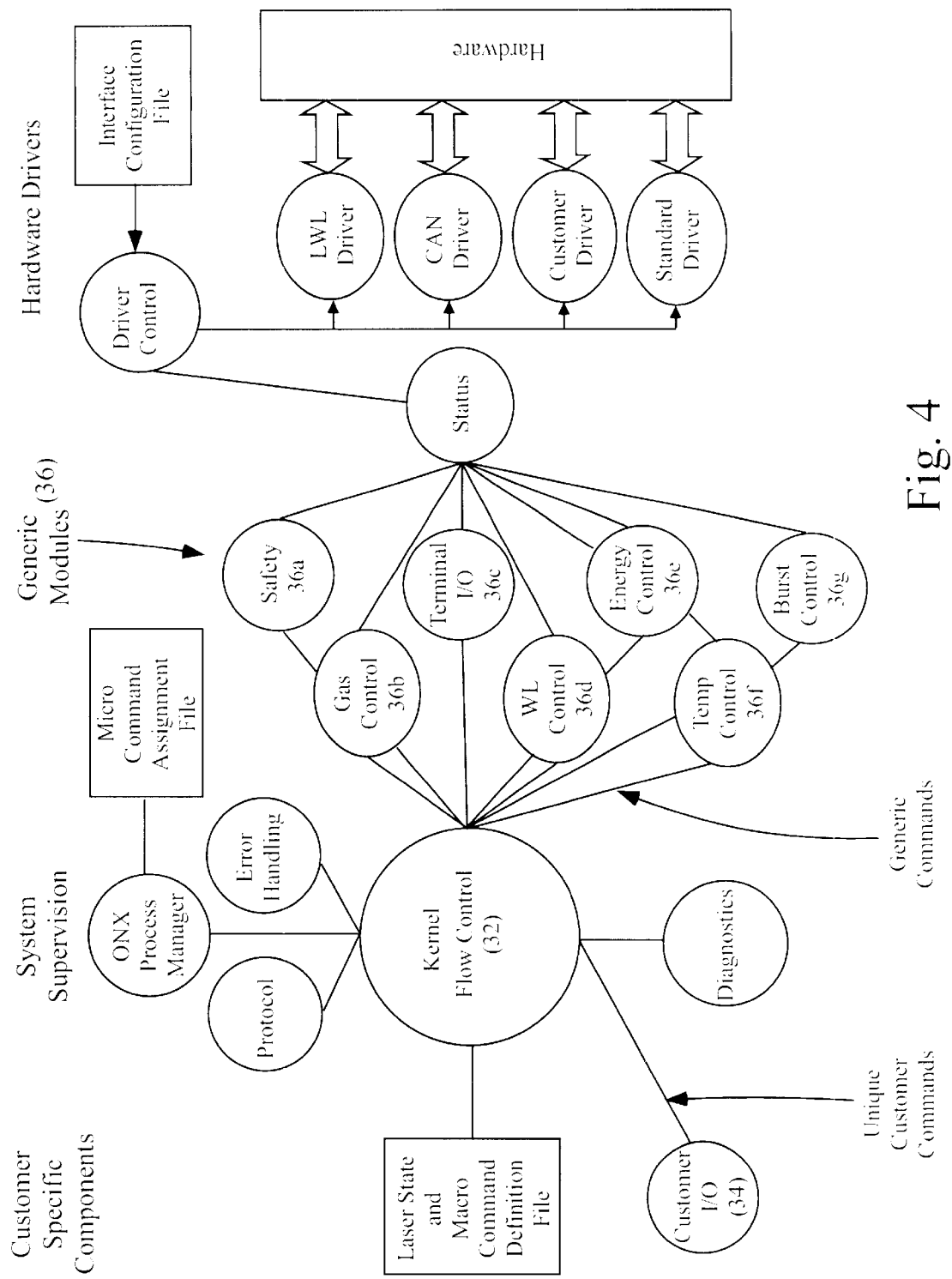
FIG. 4 illustrates the flow control kernel that receives unique customer commands and outputs generic laser system control commands in accord with a third embodiment.

FIG. 4 illustrates a flow control kernel 32 in accord with a third embodiment that receives unique customer commands from a unique customer I/O 34 and that vary depending on the customer. The kernel 32 outputs generic laser system control commands to generic control modules 36. As discussed above, unique control modules are conventionally created for each set of unique customer commands input from customer I/O 34. Advantageously, only a single set of generic control modules 36 are shown in FIG. 4 that may be used for any of multiple unique sets of customer commands or command sequences input from customer I/O 34.

The flow control kernel 32 advantageously converts the unique customer commands received from the customer I/O 34 into generic commands. The generic commands generated by the kernel from the unique commands it receives correspond to a laser function. The laser function is controlled by the generic modules 36. For example, one generic module 36 could be a laser safety module 36a such as might control a shutter. Other generic modules 36 might include a gas control module 36b, a terminal I/O module 36c, a wavelength (WL) control module 36d, an energy control module 36e, a temperature control module 36f and/or a burst control module 36g. The generic modules 36 control laser functions causing a shutter to close, the power to be turned up, a gas action to be performed, the wavelength to be adjusted, etc.

Advantageously, the kernel 32 is programmed to understand any command it might receive from the customer I/O unique to the particular customer involved. The kernel 32 may translate the commands using a universal translator or the kernel 32 may refer to a translation table of having each of the unique commands it may receive from the customer I/O corresponding to the generic command the kernel 32 is to send to the particular generic control module 32a–32g that deals with that particular generic command. Advantageously, software development time and costs are reduced according to the third aspect of the invention.

The laser simulation software programming loaded onto the simulator computer that is connected to the processor 16 through interfaces 1–6 as shown and described with respect to FIGS. 1–2 advantageously permits processor control software for next generation industrial lasers to be developed while the lasers themselves are being developed. The laser service scheduling program shown and described with respect to FIG. 3 advantageously minimizes lithography system downtimes and therefore maximizes lithography system uptime. The flow control kernel 32 shown and described with respect to FIG. 4 advantageously reduces laser control processor software development time and costs.

9. Laser Wavelength and Bandwidth Monitor

Figure 5A:
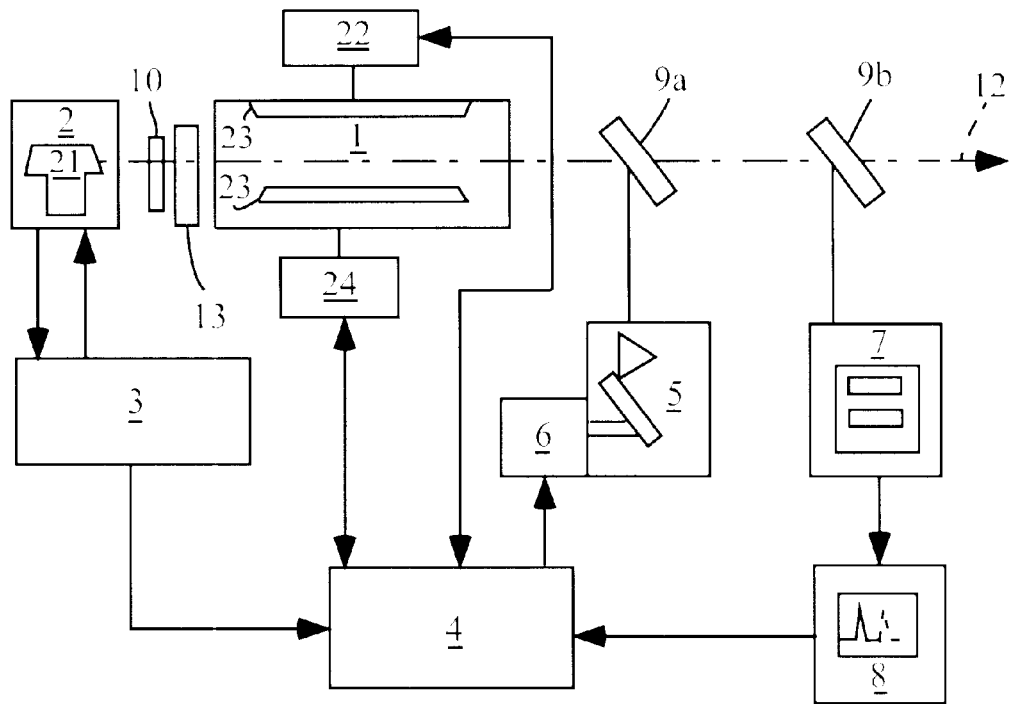
FIG. 5a schematically shows a first preferred embodiment of a laser system.

FIG. 5a schematically shows a first preferred embodiment of a laser system. A narrow band excimer or molecular fluorine laser system is the preferred laser system of FIG. 5a. The system includes a laser chamber 1 filled with a gas mixture and having a pair of main electrodes 23 and one or more preionization electrodes (not shown). The electrodes 23 are connected to a solid-state pulser and high voltage module 22. A gas handling module 24 is connected to the laser chamber 1. A laser resonator is shown surrounding the laser chamber 1 including a resonator mirror 10, a polarizer 13, a beam splitter and a line-narrowing and tuning block 5. A motor drive controls the alignment of optics such as a grating of the tuning block 5 for controlling the wavelength of the laser beam 12. A galvatron 21 is shown receiving a portion of the beam and communicating with a signal processing and driving source 3. a second beam splitter 9b is shown reflecting a portion of the beam 12 to a wavemeter which is preferably a monitor etalon 7 and an image from the etalon is projected onto a CCD array detector or display 8. A processor 4 controls various aspects of the laser system.

The monitor etalon 7 is used for performing relative wavelength calibration, whereby a wavelength of a laser beam may be tuned or shifted by a known amount. A grating spectrometer may alternatively be used. The etalon 7 produces a fringe pattern that depends on the wavelength. The fringe pattern is monitored when the wavelength is tuned or shifted, and by knowing the free spectral range of the etalon 7, the amount of wavelength shift is determined. Alternatively, the laser wavelength can be shifted a specific amount by tuning the laser and stopping the tuning when a predetermined number of free spectral ranges have been tuned through, such that it is known that the wavelength is the desired wavelength. A problem arises with conventional systems wherein the free spectral range is not precisely known for all wavelengths, and the preferred embodiments described herein below advantageously solve that problem.

The gas mixture in the laser chamber 2 typically includes about 0.1% F2, 1.0% Kr and 98.8% Ne for a KrF-laser, 0.1% F2, 1.0% Kr and 98.8% Ne and/or He for an ArF laser, and 0.1% F2 and 99.9% Ne and/or He for a $F_2$ laser (for more details on the preferred gas mixtures, see U.S. patent applications Ser. Nos. 09/447,882, 09/418,052, 09/688,561 09/416,344, 09/379,034, 09/484,818 and 09/513,025, and U.S. Pat. Nos. 4,393,505, 6,157,162 and 4,977,573, each of which is assigned to the same assignee as the present application and is hereby incorporated by reference). The laser system may be another gas discharge laser such as a KrCl, XeCl or XeF excimer laser. A trace amount of a gas additive such as xenon, argon or krypton may be included (see the '025 application, mentioned above).

The gas mixture is preferably monitored and controlled using an expert system (see the '034 application, mentioned above). One or more beam parameters indicative of the fluorine concentration in the gas mixture, which is subject to depletion, may be monitored, and the gas supply replenished accordingly (see the applications mentioned above). The processor 4 preferably receives information from various modules of the laser system including information concerning the halogen concentration in the gas mixture and initiates gas replenishment action such as micro-halogen injections, mini and partial gas replacements, and pressure adjustments by communicating with the gas handling module 24.

Although not shown, the gas handling module 24 has a series of valves connected to gas containers external to the laser system. The gas handling module 24 may also include an internal gas supply such as a halogen and/or xenon supply or generator (see the '025 application). A gas compartment (not shown) may be included in the gas handling module 24 for precise control of the micro halogen injections (see the '882 application, mentioned above, and U.S. Pat. No. 5,396,514, which is assigned to the same assignee as the present application and is hereby incorporated by reference Preferred main electrodes 23 are described at U.S. patent application Ser. No. 09/453,670, which is assigned to the same assignee as the present application and is hereby incorporated by reference. Other electrode configurations are set forth at U.S. Pat. Nos. 5,729,565 and 4,860,300, each of which is assigned to the same assignee and is hereby incorporated by reference. Preferred preionization units are set forth at U.S. patent applications Ser. Nos. 09/692,265 and 09/247,887, each of which is assigned to the same assignee as the present application and is hereby incorporated by reference. The preferred solid state pulser module and the high voltage power supply 22 are set forth at U.S. Pat. Nos. 6,020,723 and 6,005,880, and U.S. patent applications Ser. Nos. 09/640,595 and 09/390,146, each of which is assigned to the same assignee as the present application and is hereby incorporated by reference into the present application.

The resonator includes optics for line-narrowing and/or line-selection and also preferably for further narrowing the selected line. Many variations are possible For this purpose, those shown in U.S. Pat. Nos. 4,399,540, 4,905,243, 5,226,050, 5,559,816, 5,659,419, 5,663,973, 5,761,236, 6.081,542, 6,061,382, and 5,946,337, and U.S. patent applications Ser. Nos. 09/317,695, 09/130,277, 09/244,554, 09/317,527, 09/073,070, 09/452,353, 09/602,184, 09/629,256, 09/599,130, 60/170,342, 60/172,749, 60/178,620, 60/173,993, 60/166,277, 60/166,967, 60/167,835, 60/170,919, 60/186,096, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, are each hereby incorporated by reference into the present application. Some of the line selection and/or line narrowing techniques set forth in these patents and patent applications may be used in combination. The laser chamber 1 normally has tilted windows, e.g., at Brewster's angle.

The discussion of the preferred embodiment with respect to the KrF-excimer laser applies similarly throughout to the ArF and molecular fluorine ($F_2$) lasers, and when necessary, important differences will be described. The main differences for the purposes of the present invention is that the $F_2$-laser emits around 157 nm, and the ArF laser emits around 193 nm, whereas the KrF laser emits around 248 nm. Thus, the wavelength calibration system for the F2-laser and the ArF laser will be sensitive to radiation around 157 nm and 193 nm, respectively, whereas that for the KrF-excimer laser system will be sensitive around 248 nm. Also, except where discussed with respect to wavelength calibration according to the present invention, species such as water vapor and oxygen that strongly photoabsorb around 157 nm will be substantially removed from the optical path of any 157 nm radiation, whereas such substantial removal may or may not be performed in the case of 193 nm radiation and are not typically performed for the 248 nm radiation. In addition, various species will interact differently with incident 248 nm, 193 nm and 157 nm radiation.

The absolute wavelength calibration module 2 contains or comprises an element 21 which has an energy level transition line or lines around 248 nm. An energy level transition line is a detected atomic or molecular transition between atomic, electronic or molecular energy states of an element 21. An optical transition is one caused, facilitated, or stimulated by interaction of the atom or molecule with a photon of light. Examples of interactions involving optical transitions include absorption, emission, Raman scattering, and stimulated emission.

The element 21 is preferably a gaseous vapor contained within a hollow cathode lamp 2. Vaporous species that may be used as the element 21 within the module 2 have lines around 248 rim. The preferred species is iron. Some of the species that may be used for ArF lasers include arsenic (193.696 nm), germanium (193.750 nm), carbon (193.0905 nm, and other lines), iron, platinum, cobalt, gaseous hydrocarbons, halogenized hydrocarbons and carbon-contaminated inert gases. In addition, oxygen may be used-as the element 21 and has several optical transition lines within the broadband emission spectrum of the ArF-laser. For the $F_2$ laser, bromine, selenium and silicon may be used. Other species, in addition to those mentioned above, that have detectable level-transition lines within the laser emission spectrum may be used as the element 21 contained within the wavelength calibration module 2. Quasi-transparent crystals and liquids that exhibit transition lines around the laser line may also be used.

Figure 5B:
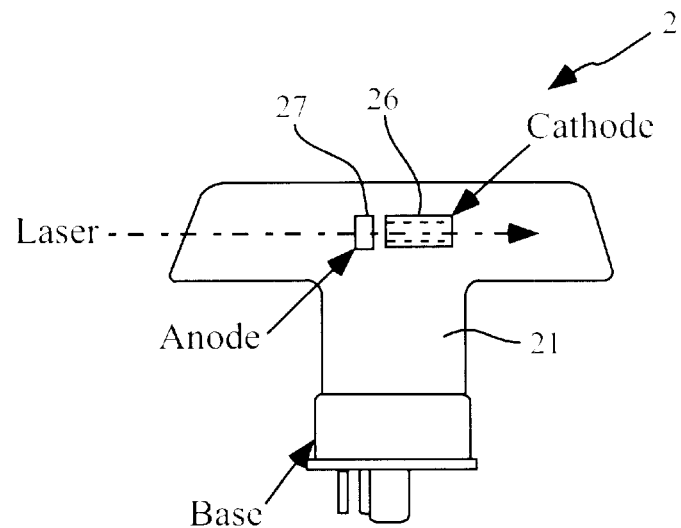
FIG. 5b schematically shows a galvatron for absolute wavelength calibration.

FIG. 5b shows a galvatron which is an example of a wavelength calibration module 2. The galvatron is preferably filled with a buffer gas and having a certain proportion of the photoabsorbing element therein. The galvatron may be purged with the element 21 in gaseous form. A laser beam portion may enter and/or exit the module through Brewster windows. A cathode 26 inside the galvatron may comprise the element 21 in solid form, and then release the element in gaseous form when a current is generated between the cathode 26 and its associated anode 27 inside the galvatron 2. Laser light from the laser chamber passes through the galvatron 2 causing an inter-level resonance of the gaseous species when the wavelength of the laser light corresponds to an inter-level transition energy of the element 21. A marked voltage change is detected between the cathode 26 and the anode 27 when the laser light is tuned to these particular wavelength(s). Therefore, when the beam has a wavelength that corresponds to an energy level transition of the gaseous species 21 within the galvatron 2, a voltage or impedance change is detected and the absolute wavelength of the narrowed band is then determinable.

Figure 5C:
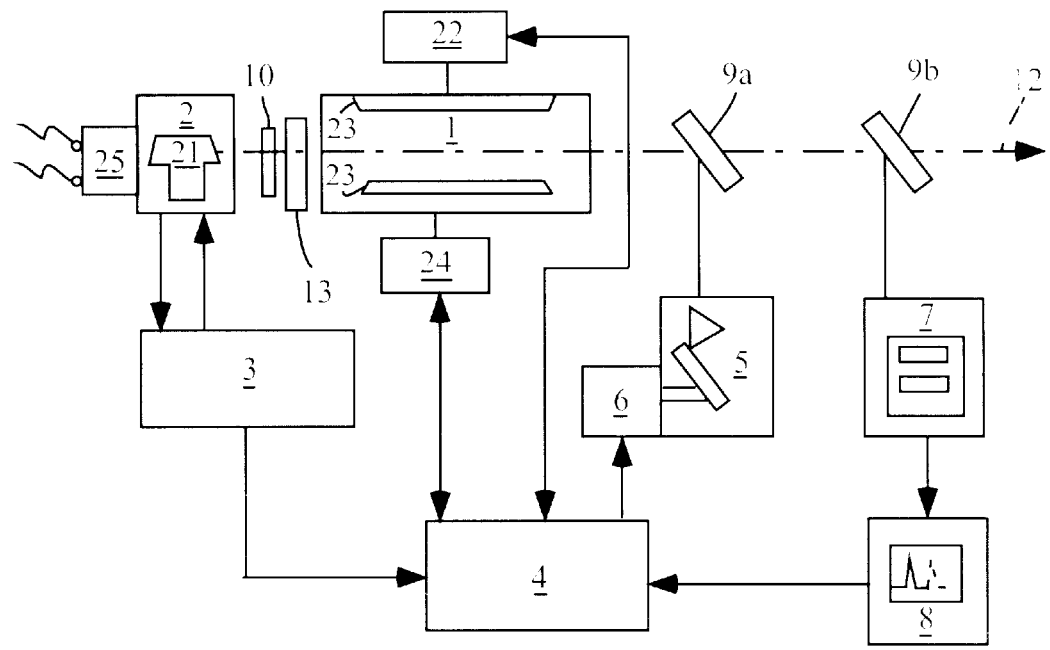
FIG. 5c schematically shows a second preferred embodiment of a laser system.

The galvatron may be used in a different way as shown in FIG. 5c. FIG. 5c includes the setup of FIG. 5a and additionally includes a photodetector 25 arranged near the galvatron. In the system of FIG. 5c, the galvatron 2 serves as a module filled with the element 21 in gaseous form, as described above. In this embodiment, the gas filled cell may be other than a galvatron, and as such, when the term galvatron is used herein it is meant broadly to mean a cell having a photoabsorbing species therein (i.e., photoabsorbing around the wavelength of interest for the laser system being used). The gaseous element 21 may be caused to fill the galvatron by forming the cathode 26 of the galvatron out of the element 21 in solid form, and running a current between the anode 27 and the cathode 26 of sufficient amplitude to sublimate the element 21.

The voltage across the anode and cathode are not monitored in the system of FIG. 5b, as they are with the system of FIG. 5a (i.e., for the purpose of detecting energy level resonances in species of the element 21 induced by the incident light). Instead, the intensity of the light as it passes through the galvatron 2 is detected. By so doing, absorption lines of the element 21 are detected when the detected intensity is reduced below that which is expected at the wavelengths corresponding to the absorption lines. Since the absolute wavelengths of photoabsorption are known for the element 21, the absolute wavelength of the laser light is determinable.

The wavelength of the laser light is determined from a knowledge of the energy band levels and transition probabilities of species of the gaseous element 21. That is, when the wavelength of the laser beam is tuned within the emission spectrum of the laser, the absolute wavelength of the beam is precisely determined each time it corresponds to an inter-level transition energy of the gaseous species 21 having a finite transition probability density. The absolute wavelengths of the transition level resonance modes are precisely and reliably known since they are determined by relative positions of adjacent or removed quantized energy states of the photo-absorbing element, and applicable transition-selection rules.

Figure 6:
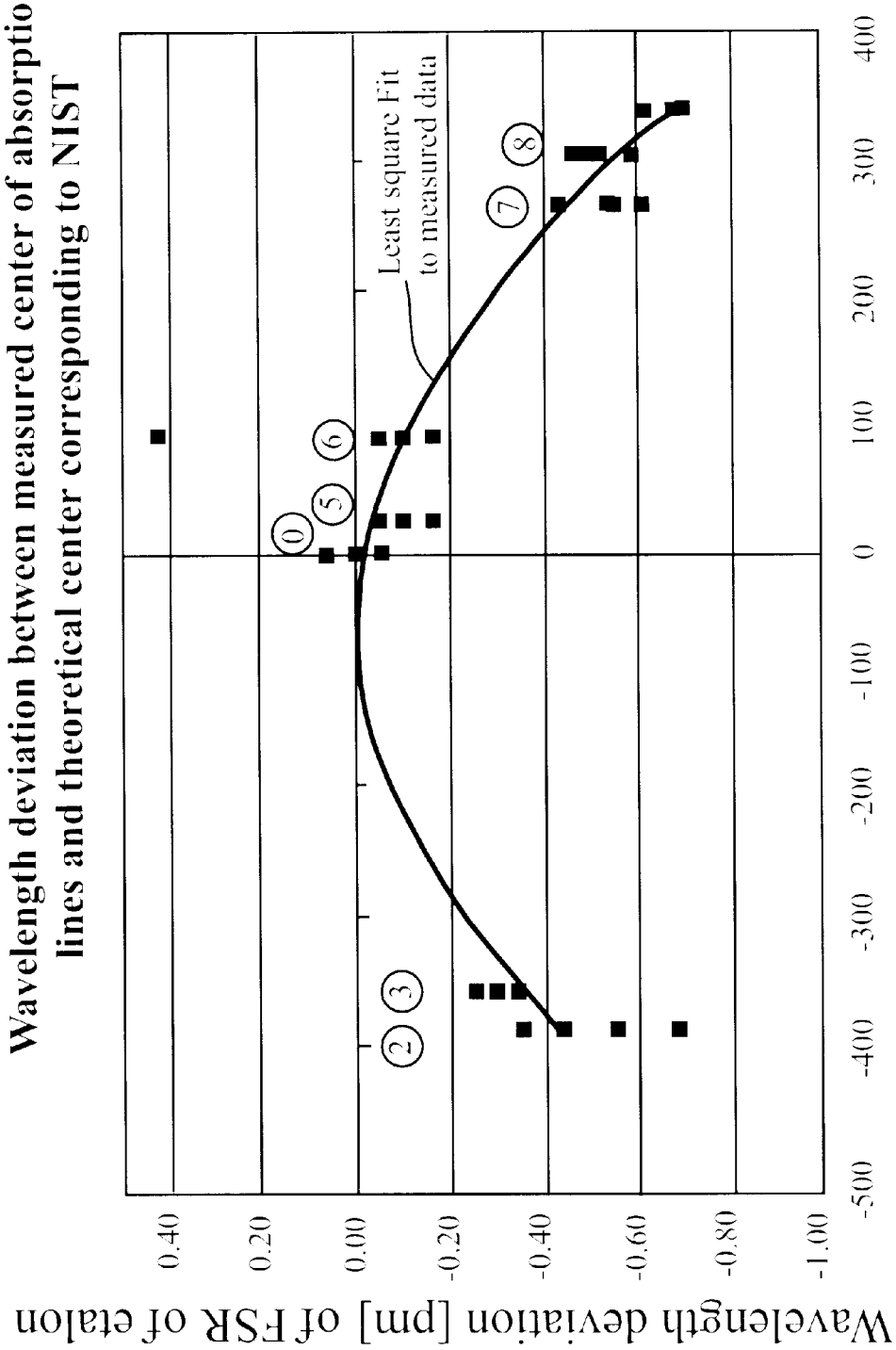
FIG. 6 shows a graph of measured wavelength deviations as a function of wavelength shifts from a reference line, and a least squares fit to the measured data.

FIG. 6 shows a graph of measured wavelength deviations as a function of wavelength shifts from a zeroeth reference line, and a least squares fit to the measured data. The zeroeth reference line is one of the transition lines discussed above for the gaseous species within the galvatron 2. Other reference lines may be used such as of a reference laser or mercury lamp line, and the absolute wavelength of laser determined based on a comparison of interferometric or spectrometric images produced by the reference and laser lines (see U.S. Pat. No. 6,160,831, which is assigned to the same assignee and is hereby incorporated by reference). The other reference lines used are for other transition lines of the gaseous species (in this case, iron) in the galvatron 2.

The peak positions of the transition lines measured using the monitor etalon 7 are observed to deviate from the known positions of the transition lines recorded at NIST. These deviations are understood to be due to a wavelength shift dependence of the FSR, which is taken as "constant" for measuring the wavelength shift using the monitor etalon. A least squares fit to the measured data is calculated is also shown overlaying the data shown at FIG. 6.

FIGS. 7–13 show the measured spectra of the interaction with absorption lines of the species in the galvatron 2 as a function of the relative wavelength shift from a zeroeth reference line (in this case at 248.3271 nm) measured using the monitor etalon 7. These measurements and the calculations and descriptions that follow can be performed for any reference line taken as the zeroeth reference line around any of the laser wavelengths (e.g., 248 nm, 193 nm and 157 nm) if there are other reference wavelengths to tune to. Bromine, e.g., has two lines around 157 nm that may be used. Oxygen and carbon also have several lines that can be used around 193 nm. The various lines are indicated in FIG. 2 (and later at FIGS. 10–11) as numbered reference lines (0), (2), (3), (5), (6), (7), and (8). The lines shown at FIGS. 7–13 represent only one data point of several that were taken for illustration purposes.

Figure 7:
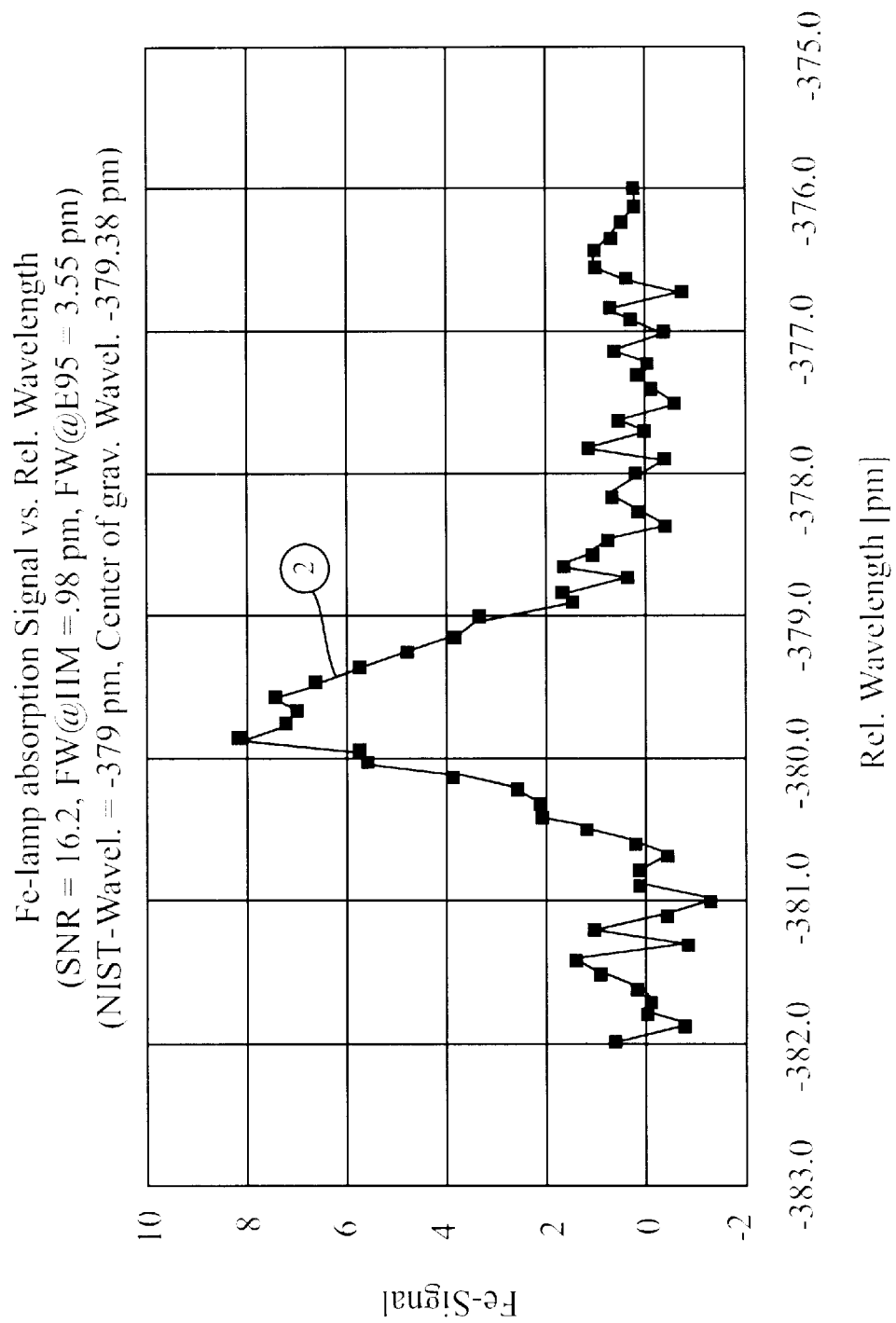
FIGS. 7–13 show seven graphs of measured wavelength photoabsorption signals at different reference lines as a function of wavelength shift from 248.327 nm.

FIG. 7 shows a graph of measured photoabsorption signal at a second reference line (2) as a function of wavelength shift from a zeroeth reference line (0). The center of gravity of the measured second reference absorption line was −379.38 pm, whereas the NIST wavelength is −379 pm, corresponding to a −0.38 pm deviation.

Figure 8:
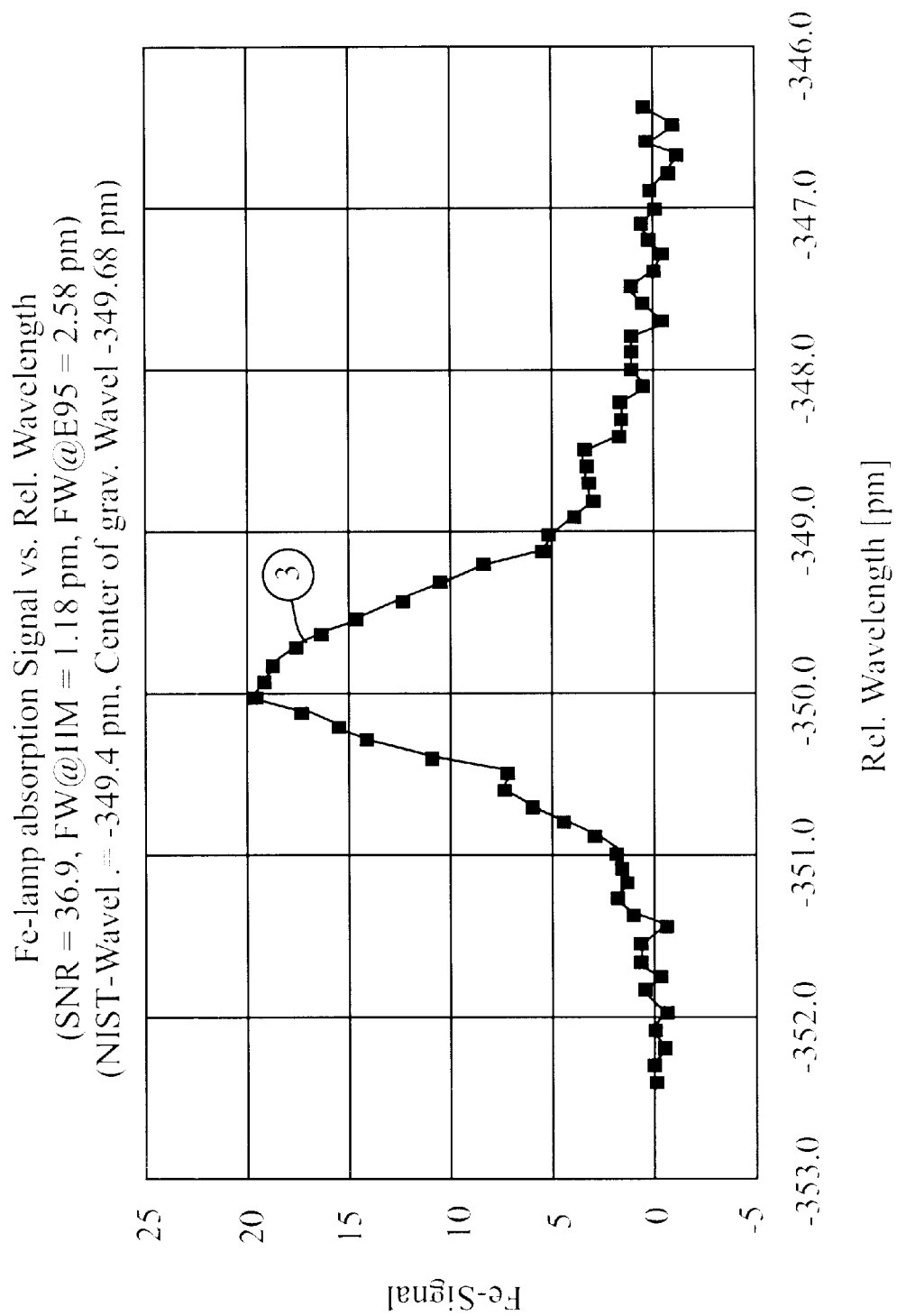

FIG. 8 shows a graph of measured photoabsorption signal at a third reference line (3) as a function of wavelength shift from the zeroeth reference line (0). The center of gravity of the measured third reference absorption line (3) was −349.68 pm, whereas the NIST wavelength is −349.4 pm, corresponding to a −0.28 pm deviation.

Figure 9:
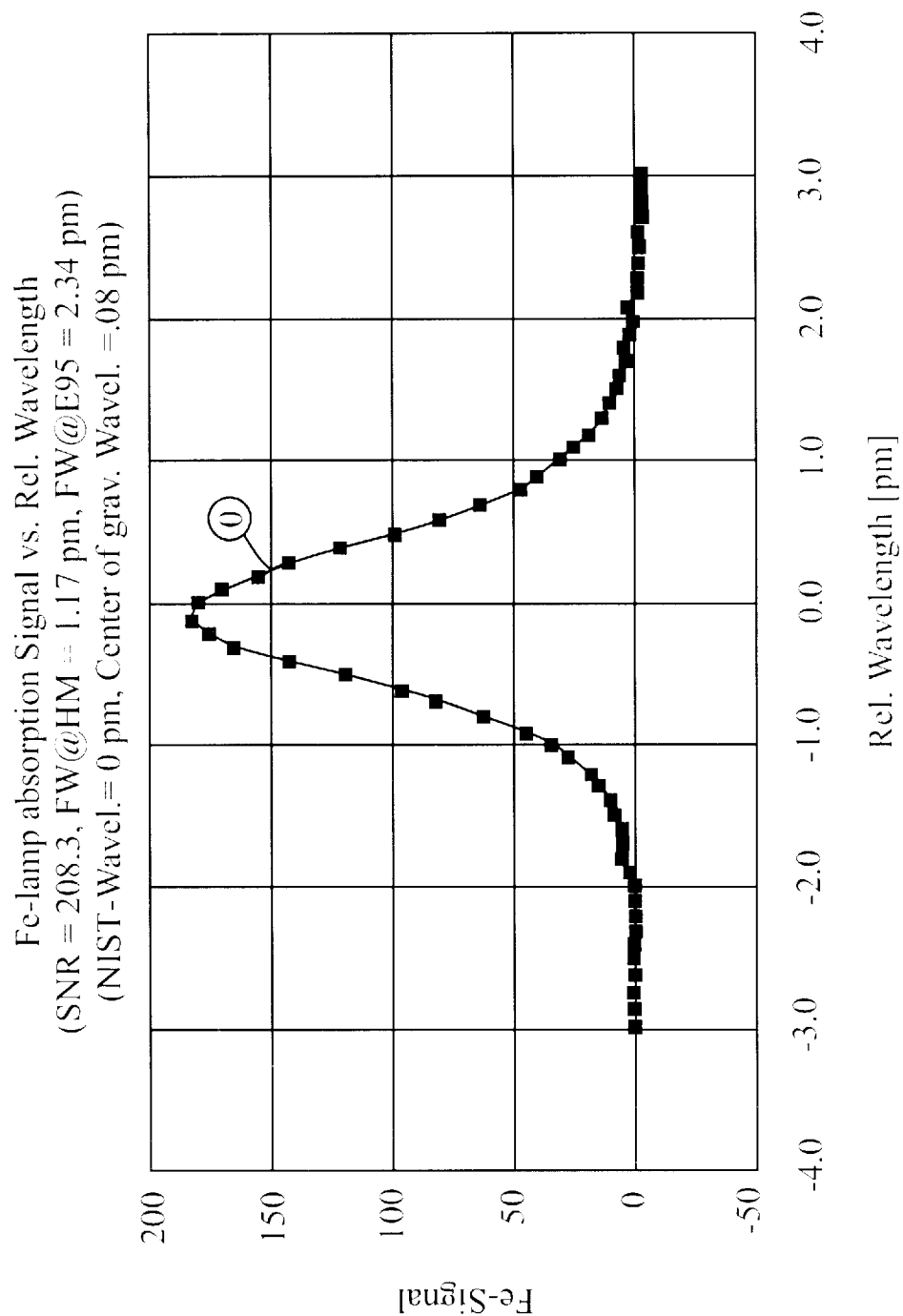

FIG. 9 shows a graph of measured photoabsorption signal at the zeroeth reference line (0) as a function of wavelength shift from the zeroeth reference line (0). The center of gravity of the measured zeroeth reference absorption line (0) was 0.08 pm, whereas the NIST wavelength is 0 pm, corresponding to a 0.08 pm deviation. This deviation is used for offset correction of the wavelength scale.

Figure 10:
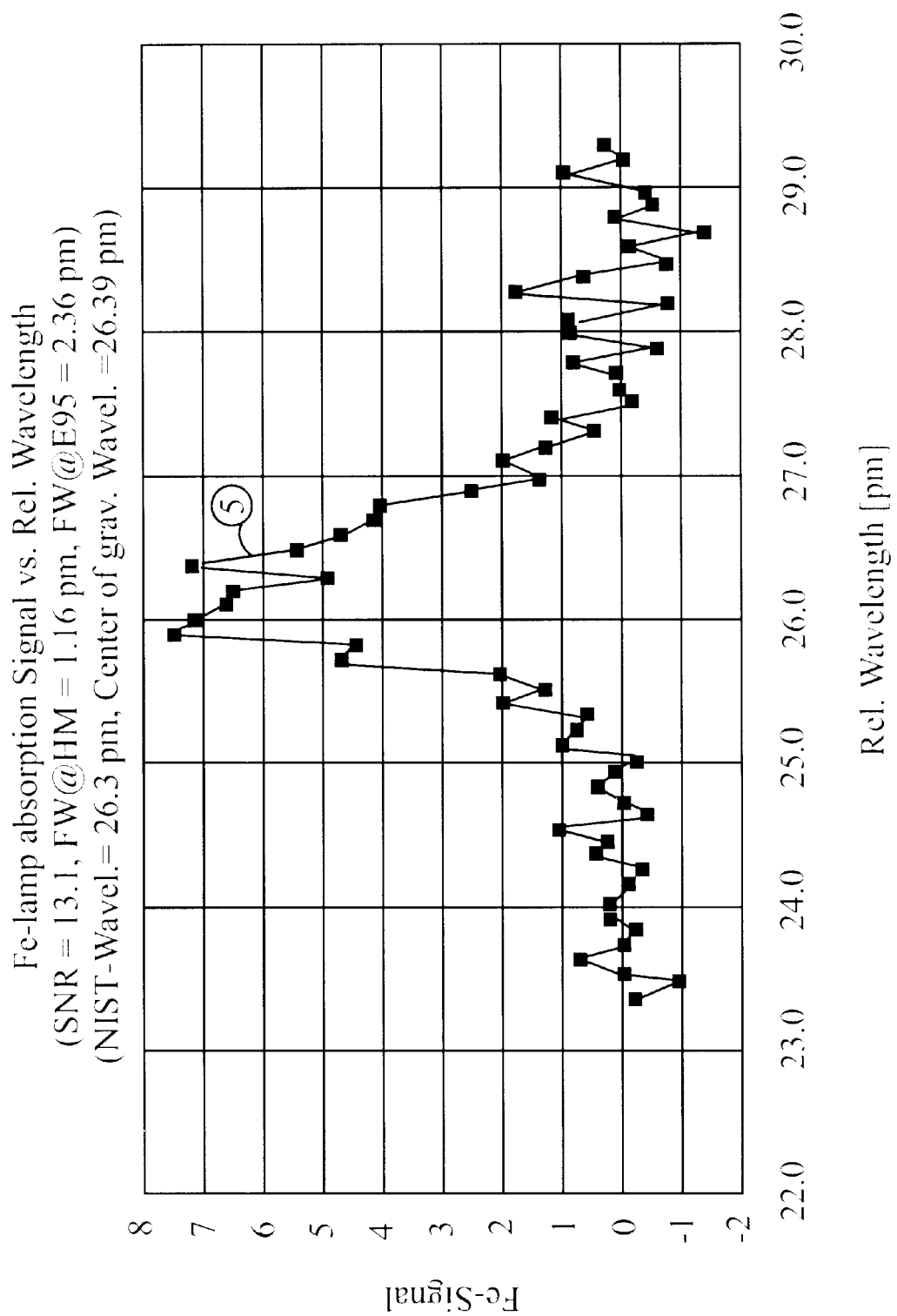

FIG. 10 shows a graph of measured photoabsorption signal at a fifth reference line (5) as a function of wavelength shift from the zeroeth reference line (0). The center of gravity of the measured fifth reference absorption line (5) was 26.39 pm, whereas the NIST wavelength is 26.3 pm, corresponding to a 0.09 pm deviation.

Figure 11:
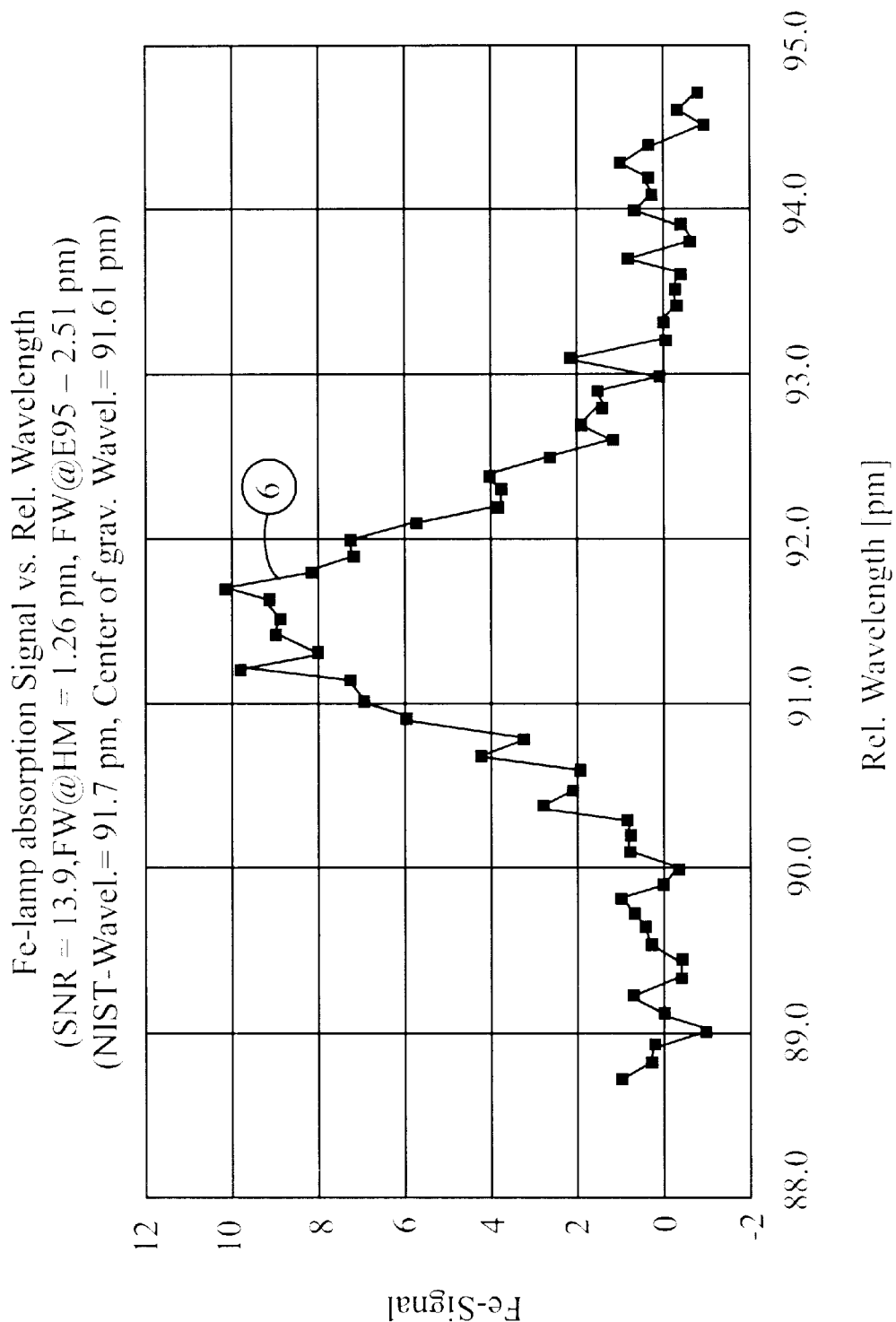

FIG. 11 shows a graph of measured photoabsorption signal at a sixth reference line (6) as a function of wavelength shift from the zeroeth reference line (0). The center of gravity of the measured sixth reference absorption line (6) was 91.61 pm, whereas the NIST wavelength is 91.7 pm, corresponding to a 0.09 pm deviation.

Figure 12:
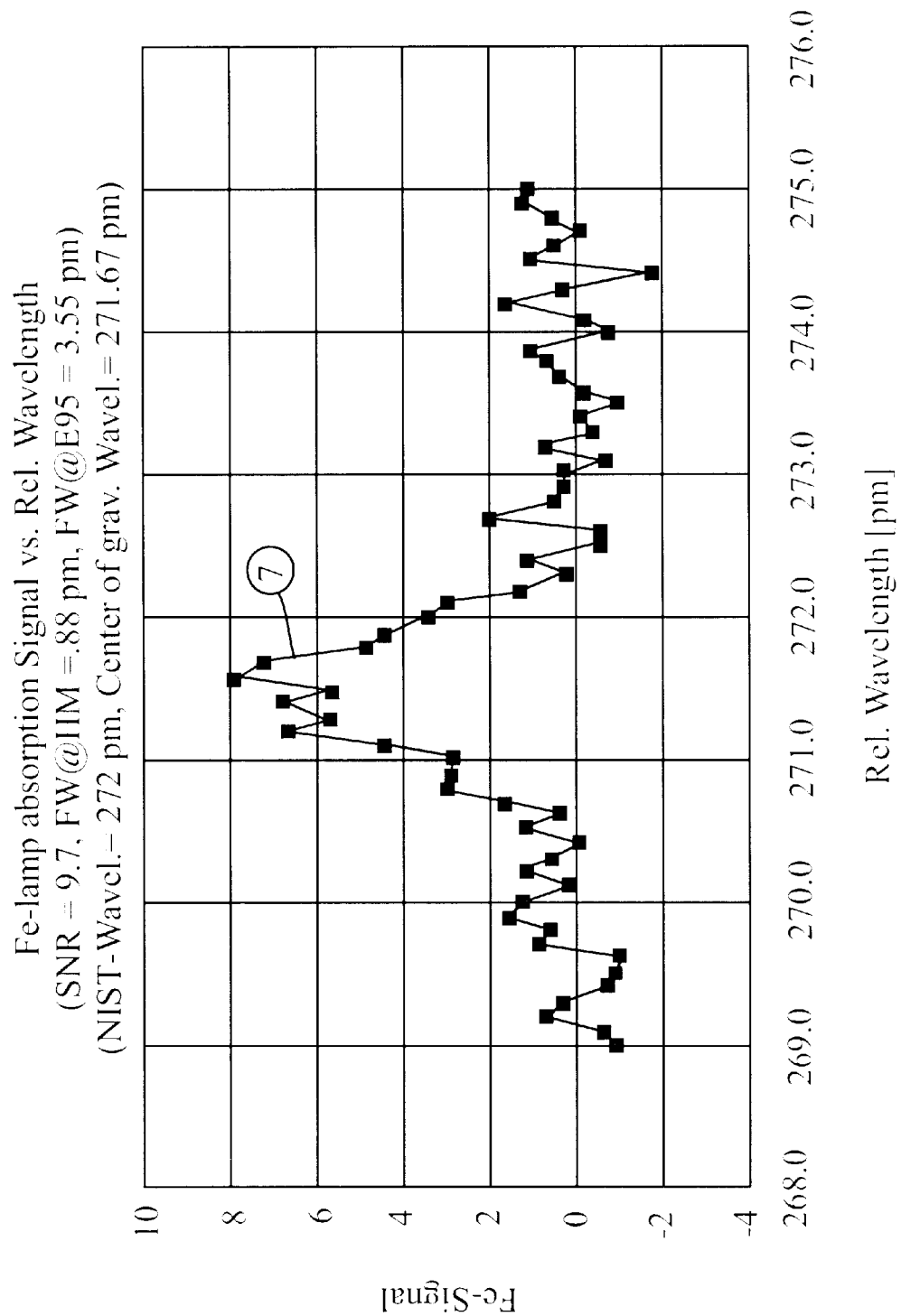

FIG. 12 shows a graph of measured photoabsorption signal at a seventh reference line (7) as a function of wavelength shift from the zeroeth reference line (0). The center of gravity of the measured seventh reference absorption line (7) was −271.67 pm, whereas the NIST wavelength is 272 pm, corresponding to a 0.33 pm deviation.

Figure 13:
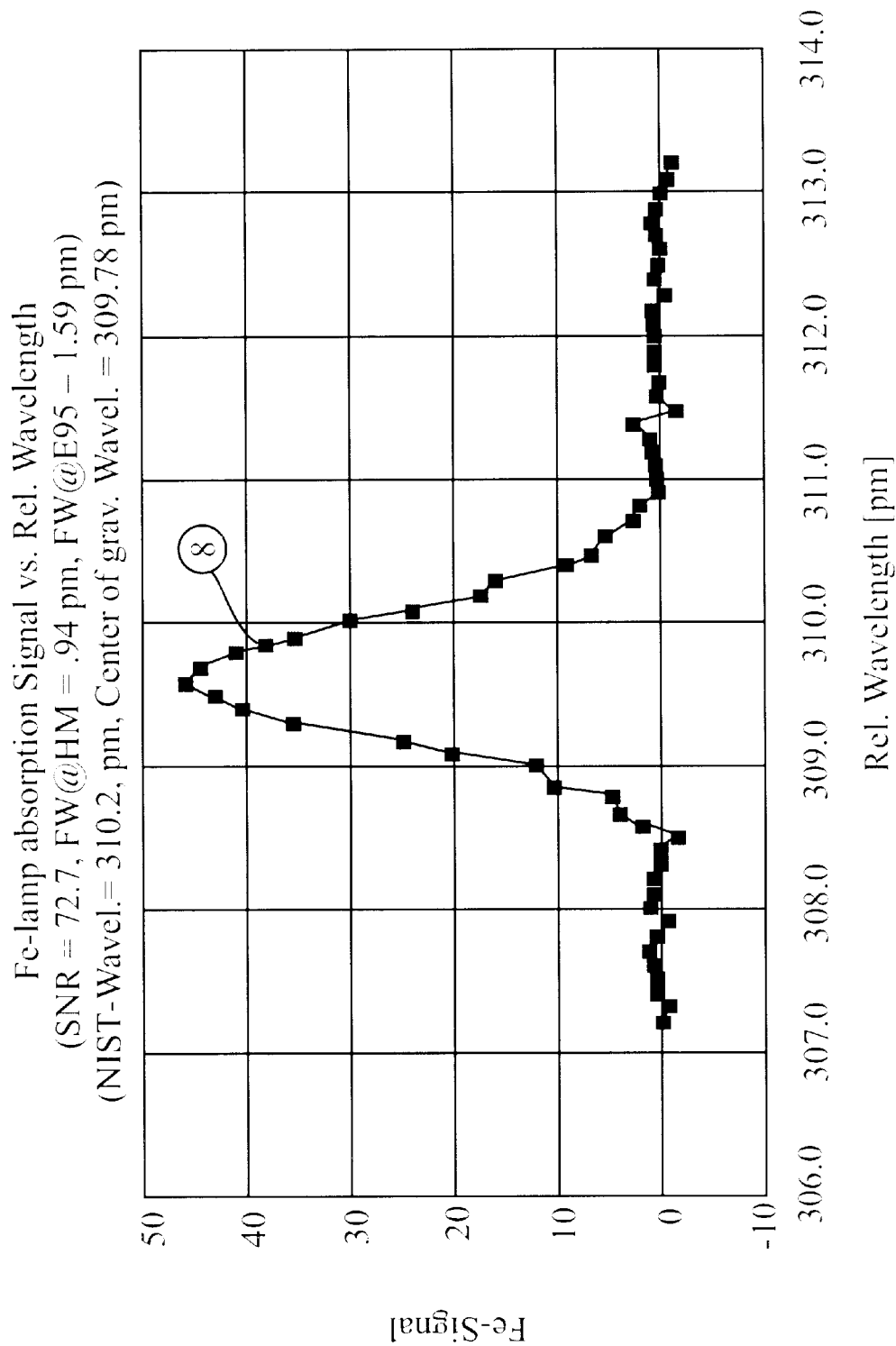

FIG. 13 shows a graph of measured photoabsorption signal at a eighth reference line (8) as a function of wavelength shift from the zeroeth reference line (0). The center of gravity of the measured eighth reference absorption line (8) was 309.76 pm, whereas the NIST wavelength is 310.2 pm, corresponding to a 0.44 pm deviiaition.

As mentioned above, conventional relative wavelength calibration techniques take the wavelength dependence of the FSR of the etalon to be a constant (e.g., 9.25 pm). If this were correct, the measured positions of the reference lines would correspond exactly to the NIST wavelengths, and no deviations would have been observed, as shown and discussed with respect to FIGS. 6–13, and all of the data points would have been on the horizontal zero axis of FIG. 6. FIG. 6 shows, however, particularly the least squares fit, that the FSR deviates as the square of the wavelength $\lambda$, which is the reference wavelength $\lambda_0$ plus the wavelength shift $\Delta\lambda$. The FSR can in fact be taken as the following function of wavelength:

$$FSR(\lambda_0 + \Delta\lambda) = ((\lambda_0 + \Delta\lambda)^2 / 2nd \quad (1);$$

where $\lambda_0$ is the zeroeth reference line at 248.3271 nm, $\Delta\lambda$ is the relative shift from the zeroeth reference line $\lambda_0$, n is the index of refraction of the medium in the gap between the etalon plates, and d is the gap spacing. The gap spacing d is generally taken as 3333.000 microns for the etalon 7 used for relative wavelength monitoring.

Figure 14:
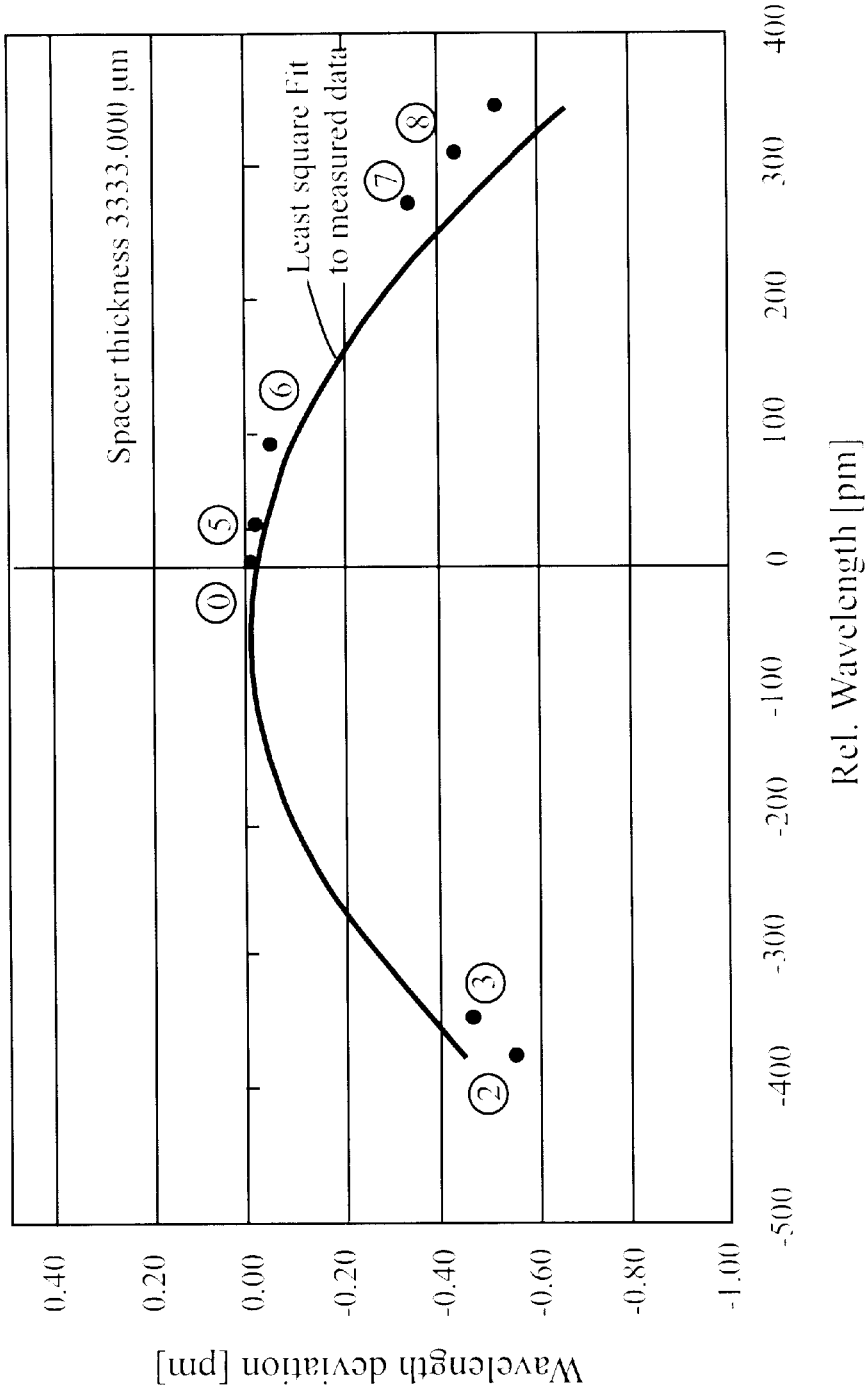
FIG. 14 shows a graph of calculated wavelength deviations as a function of wavelength shifts from a reference line using a gap spacing of 3333.00 microns, wherein the least squares fit of FIG. 6 (solid line) is overlayed with the calculated deviations (squares).

FIG. 14 shows a graph of calculated wavelength deviations as a function of wavelength shifts from a zeroeth reference line (0) using a gap spacing of 3333.00 microns, wherein the least squares fit of FIG. 6 is overlayed with the calculated deviations. A comparison of the overlayed fit with the calculated data points corresponding to the measured deviations at the same relative shifts reveals that the calculated data is not precisely matched with the measured data. Although using the calculated data plotted in FIG. 14 would be more precise than using a constant FSR (or the horizontal zero axis), a more precise technique is desired.

Figure 15:
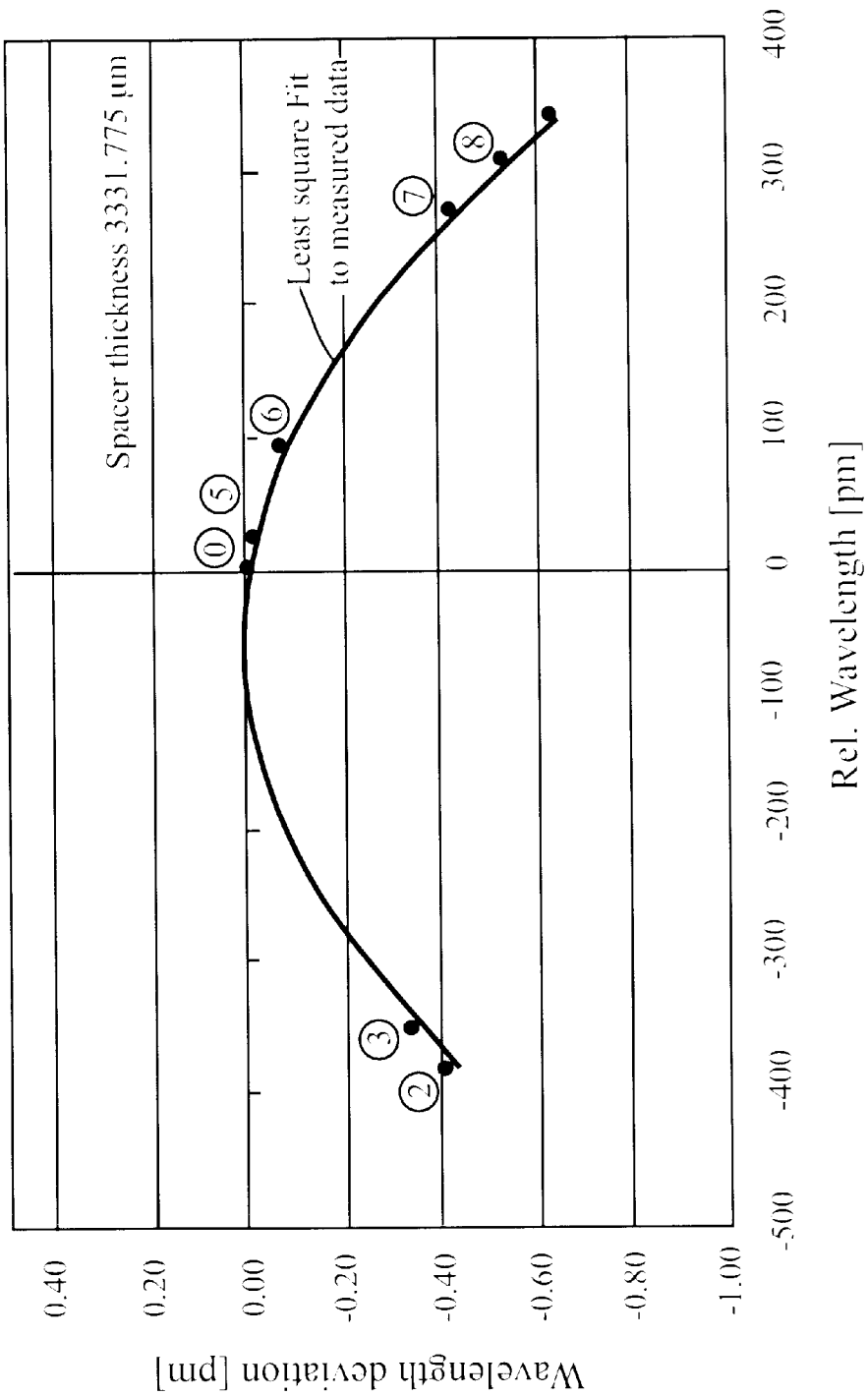
FIG. 15 shows a graph of calculated wavelength deviations as a function of wavelelength shifts from a reference line using a gap spacing of 3331.775 microns in accord with the present invention, wherein the least squares fit of FIG. 10 is overlayed with the calculated deviations.

It is thus recognized in the present invention that equation (1) should be modified to give a more precise fit to the data. The spacing d was thus varied, and can otherwise be referred to herein as an "etalon constant". FIG. 15 shows a graph of calculated wavelength deviations as a function of wavelength shifts from the zeroeth reference line (0) using a gap spacing of 3331.775 microns, wherein the least squares fit of FIG. 6 is again overlayed with the calculated deviations. The calculated data points match quite nicely with the measured fit as shown in FIG. 15.

The FSR used for determining the relative shift from a reference line based on measurements using the monitor etalon more accurately fits the measured data. Thus the relative wavelength determination is more precisely performed in accord with the preferred embodiment. In this first aspect, a modification may be used wherein absorption lines are shifted instead of the laser line, e.g., for carrying out the measurements of FIGS. 7–13.

Another embodiment is described below with reference to FIGS. 16a–16d. FIG. 16a shows a substantially gaussian lineshape such as corresponds to an output pulse of the laser system of FIG. 5a. The bandwidth of the pulse is generally taken as the full width at half maximum (FWHM) as shown in FIG. 16a. The bandwidth may be determined other than at half maximum such as, e.g., at 1/e or $1/e^2$ of the maximum. The spectral purity is generally taken to be the spectral range within which lies 95% of the energy of the pulse (FW@E95). Both the FWHM and the FW@E95 are important parameters of the laser beam, particularly of a lithography laser as mentioned above. It is therefore important to be able to measure accurately what each of these parameters is.

FIG. 16b shows two overlayed line shapes of the same spectral feature. In accord with the present invention that spectral feature is an absorption line of the gaseous species 21 in the galvatron 2. The laser beam is scanned through the absorption line and the absorption spectrum of the absorption line is measured. The measured lineshape however depends on the bandwidth and spectral purity of the laser beam, and the measured spectrum is convoluted due to that finite bandwidth and spectral purity. The measured bandwidth is thus broadened by convolution.

Thus, if the laser beam has a zero bandwidth and spectral purity, and is a delta function, then the measured bandwidth and spectral purity of the absorption line would exactly match the real absorption lineshape. However, if the laser beam has a first bandwidth and first spectral purity, then the convoluted absorption spectrum (a) shown in FIG. 16b would be measured. If the laser beam had a broader second bandwidth and a broader second spectral purity, then the convoluted spectrum (b) shown in FIG. 16b would be measured. The bandwidth of spectrum (a) is shown as FWHM(a) and the spectral purity of spectrum (a) is shown as FW@E95(a). The bandwidth of spectrum (b) is shown as FWHM(b) and the spectral purity of spectrum (b) is shown as FW@E95(b).

It is recognized in the present invention, that the bandwidth of a laser beam can be determined based on a knowledge of dependence of the laser bandwidth and spectral purity on the convolution of the absorption lineshape. FIG. 16c shows a dependence of the measured absorption bandwidth FWHM on the laser bandwidth FWHM. A measurement of the convoluted bandwidth FWHM of the absorption line of the gas species in the galvatron can thus be followed by a calculation of the laser bandwidth using a function that corresponds with the illustrative linear plot shown at FIG. 16c.

FIG. 16d shows a dependence of the measured absorption spectral purity FW@E95 on the spectral purity of the laser beam FW@E95. A measurement of the convoluted spectral purity FW@E95 of the absorption line of the gas species in the galvatron can thus be followed by a calculation of the laser spectral purity FW@E95 using a function that corresponds with the illustrative linear plot shown at FIG. 16d.

The second object of the invention is thus met. Spectral characteristics such as the bandwidth and spectral purity of a laser beam can be calculated from measured values of the bandwidth and spectral purity of an absorption line using the laser beam to measure the absorption spectrum.

OVERALL LASER SYSTEM

Figure 17:
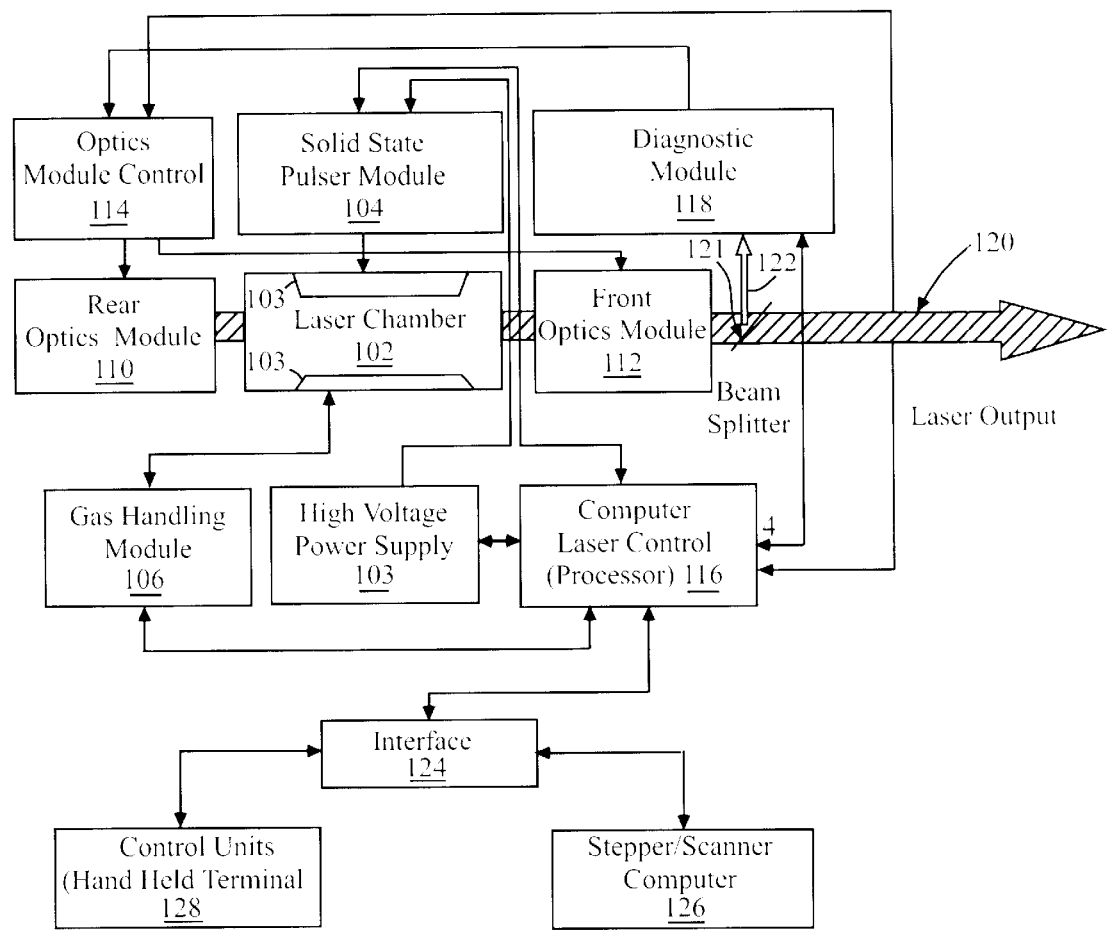
FIG. 17 schematically illustrates an excimer or molecular fluorine laser system according to a preferred embodiment.

FIG. 17 schematically illustrates an overall excimer or molecular fluorine laser system according to a preferred embodiment which preferably includes the advantageous features described above. It is also noted that the above may be used with an EUV system, and as such, U.S. patent applications Ser. Nos. 60/312,277 and 60/281,446, which are assigned to the same assignee as the present application, and all reference cited in the '277 and '446 applications, are hereby incorporated by reference as disclosure EUV radiation generating systems, components and features that may be used in combination with the above and/or the below. Referring to FIG. 17, a preferred excimer or molecular fluorine laser system is a DUV or VUV laser system, such as a KrF, ArF or molecular fluorine ($F_2$) laser system, for use with a deep ultraviolet (DUV) or vacuum ultraviolet (VUV) lithography system. Alternative configurations for laser systems for use in such other industrial applications as TFT annealing, photoablation and/or micromachining, e.g., include configurations understood by those skilled in the art as being similar to and/or modified from the system shown in FIG. 17 to meet the requirements of that application. For this purpose, alternative DUV or VUV laser system and component configurations are described at U.S. patent applications Ser. Nos. 09/317,695, 09/244,554, 09/452,353, 09/512,417, 09/599,130, 09/694,246, 09/712,877, 09/574,921, 09/738,849, 09/718,809, 09/629,256, 09/712,367, 09/771,366, 09/715,803, 09/738,849, 09/791,431, 60/204,095, 09/741,465, 09/574,921, 09/734,459, 09/741,465, 09/686,483, 09/584,420, 09/843,604, 09/780,120, 09/792,622, 09/791,431, 09/811,354, 09/838,715, 09/715,803, 09/717,757, 09/771,013, 09/791,430, 09/712,367 and 09/780,124, and U.S. Pat. Nos. 6,285,701, 6,005,880, 6,061,382, 6,020,723, 6,219,368, 6,212,214, 6,154,470, 6,157,662, 6,243,405, 6,243,406, 6,198,761, 5,946,337, 6,014,206, 6,157,662, 6,154,470, 6,160,831, 6,160,832, 5,559,816, 4,611,270, 5,761,236, 6,212,214, 6,243,405, 6,154,470, and 6,157,662, each of which is assigned to the same assignee as the present application and is hereby incorporated by reference.

DISCHARGE TUBE

The system shown in FIG. 17 generally includes a laser chamber 102 (or laser tube including a heat exchanger and fan for circulating a gas mixture within the chamber 102 or tube) having a pair of main discharge electrodes 103 connected with a solid-state pulser module 104, and a gas handling module 106. The gas handling module 106 has a valve connection to the laser chamber 102 so that halogen, any active rare gases and a buffer gas or buffer gases, and optionally a gas additive, may be injected or filled into the laser chamber, preferably in premixed forms (see U.S. patent applications Ser. Nos. 09/513,025, 09/780,120, 09/734,459 and 09/447,882, which are assigned to the same assignee as the present application, and U.S. Pat. Nos. 4,977,573, 4,393,505 and 6,157,662, which are each hereby incorporated by reference. The solid-state pulser module 104 is powered by a high voltage power supply 108. A thyratron pulser module may alternatively be used. The laser chamber 102 is surrounded by optics module 110 and optics module 112, forming a resonator. The optics modules 110 and 112 may be controlled by an optics control module 114, or may be alternatively directly controlled by a computer or processor 116, particular when line-narrowing optics are included in one or both of the optics modules 110, 112, such as is preferred when KrF, ArF or $F_2$ lasers are used for optical lithography.

PROCESSOR CONTROL

The processor 116 for laser control receives various inputs and controls various operating parameters of the system. A diagnostic module 118 receives and measures one or more parameters, such as pulse energy, average energy and/or power, and preferably wavelength, of a split off portion of the main beam 120 via optics for deflecting a small portion 122 of the beam toward the module 118, such as preferably a beam splitter module 121. The beam 120 is preferably the laser output to an imaging system (not shown) and ultimately to a workpiece (also not shown) such as particularly for lithographic applications, and may be output directly to an application process. The laser control computer 116 may communicate through an interface 124 with a stepper/scanner computer, other control units 126, 128 and/or other external systems.

The processor or control computer 116 receives and processes values of some of the pulse shape, energy, ASE, energy stability, energy overshoot for burst mode operation, wavelength, spectral purity and/or bandwidth, among other input or output parameters of the laser system and output beam. The processor may receive signals corresponding to the wavefront compensation such as values of the bandwidth, and may control the wavefront compensation performed by the wavefront compensation optic in a feedback loop by sending signals to adjust the pressure(s) and/or curvature(s) of surfaces associated with the wavefront compensation optic. The processor 116 also controls the line narrowing module to tune the wavelength and/or bandwidth or spectral purity, and controls the power supply and pulser module 104 and 108 to control preferably the moving average pulse power or energy, such that the energy dose at points on the workpiece is stabilized around a desired value. In addition, the computer 116 controls the gas handling module 106 which includes gas supply valves connected to various gas sources. Further functions of the processor 116 such as to provide overshoot control, energy stability control and/or to monitor input energy to the discharge, are described in more detail at U.S. patent application Ser. No. 09/588,561, which is assigned to the same assignee and is hereby incorporated by reference.

As shown in FIG. 17, the processor 116 preferably communicates with the solid-state or thyratron pulser module 104 and HV power supply 108, separately or in combination, the gas handling module 106, the optics modules 110 and/or 112, the diagnostic module 118, and an interface 124. The laser resonator which surrounds the laser chamber 102 containing the laser gas mixture includes optics module 110 including line-narrowing optics for a line narrowed excimer or molecular fluorine laser, which may be replaced by a high reflectivity mirror or the like in a laser system wherein either line-narrowing is not desired, or if line narrowing is performed at the front optics module 112, or a spectral filter external to the resonator is used for narrowing the linewidth of the output beam.

SOLID STATE PULSER MODULE

The laser chamber 102 contains a laser gas mixture and includes one or more preionization units (not shown) in addition to the pair of main discharge electrodes 103. Preferred main electrodes 103 are described at U.S. patent application Ser. No. 09/453,670 for photolithographic applications, which is assigned to the same assignee as the present application and is hereby incorporated by reference, and may be alternatively configured, e.g., when a narrow discharge width is not preferred. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. Preferred preionization units may be sliding surface or corona-type and are described U.S. patent applications Ser. Nos. 09/922,241 and 09/532,276 (sliding surface) and Ser. Nos. 09/692,265 and 09/247,887 (corona discharge), each of which is assigned to the same assignee as the present application, and additional alternative embodiments are set forth at U.S. Pat. Nos. 5,337,330, 5,818,865, 5,875,207 and 5,991,324, and German Gebrauchmuster DE 295 21 572 U1, all of the above patents and patent applications being hereby incorporated by reference.

The solid-state or thyratron pulser module 104 and high voltage power supply 108 supply electrical energy in compressed electrical pulses to the preionization and main electrodes 103 within the laser chamber 102 to energize the gas mixture. Components of the preferred pulser module and high voltage power supply are described above, and further details may be described at U.S. patent applications Ser. Nos. 09/640,595, 09/838,715, 60/204,095, 09/432,348 and 09/390,146, and U.S. Pat. Nos. 6,005,880, 6,226,307 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872, 6,151,346 and 5,729,562, each of which is hereby incorporated by reference.

RESONATOR, GENERAL

The laser resonator which surrounds the laser chamber 102 containing the laser gas mixture includes optics module 110 preferably including line-narrowing optics for a line narrowed excimer or molecular fluorine laser such as for photolithography, which may be replaced by a high reflectivity mirror or the like in a laser system wherein either line-narrowing is not desired (for TFT annealling, e.g.), or if line narrowing is performed at the front optics module 112, or a spectral filter external to the resonator is used, or if the line-narrowing optics are disposed in front of the HR mirror, for narrowing the bandwidth of the output beam. For an $F_2$-laser, optics for selecting one of multiple lines around 157 nm may be used, e.g., one or more dispersive prisms, birefringent plates or blocks and/or an interferometric device such as an etalon or a device having a pair of opposed, non-parallel plates such as described in the 09/715,803 and 60/280,398 applications, wherein the same optic or optics or an additional line-narrowing optic or optics for narrowing the selected line may be used. Also, particularly for the $F_2$-laser, and also possibly for other excimer lasers, the total gas mixture pressure may be lower than conventional systems, e.g., lower than 3 bar, for producing the selected line at a narrow bandwidth such as 0.5 pm or less without using additional line-narrowing optics (see U.S. patent application Ser. No. 09/883,128, which is assigned to the same assignee as the present application and is hereby incorporated by reference).

The laser chamber 102 is sealed by windows transparent to the wavelengths of the emitted laser radiation 120. The windows may be Brewster windows or may be aligned at another angle, e.g., 5°, to the optical path of the resonating beam. One of the windows may also serve to output couple the beam or as a highly reflective resonator reflector on the opposite side of the chamber 102 as the beam is outcoupled.

DIAGNOSTIC MODULE

After a portion of the output beam 120 passes the outcoupler of the optics module 112, that output portion preferably impinges upon a beam splitter module 121 which includes optics for deflecting a portion 122 of the beam to the diagnostic module 118, or otherwise allowing a small portion 122 of the outcoupled beam to reach the diagnostic module 118, while a main beam portion 120 is allowed to continue as the output beam 120 of the laser system (see U.S. patent applications Ser. Nos. 09/771,013, 09/598,552, and 09/712,877 which are assigned to the same assignee as the present invention, and U.S. Pat. No. 4,611,270, each of which is hereby incorporated by reference. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 118. A holographic beam sampler, transmission grating, partially transmissive reflection diffraction grating, grism, prism or other refractive, dispersive and/or transmissive optic or optics may also be used to separate a small beam portion from the main beam 120 for detection at the diagnostic module 118, while allowing most of the main beam 120 to reach an application process directly or via an imaging system or otherwise. These optics or additional optics may be used to filter out visible radiation such as the red emission from atomic fluorine in the gas mixture from the split off beam prior to detection.

The output beam 120 may be transmitted at the beam splitter module while a reflected beam portion is directed at the diagnostic module 118, or the main beam 120 may be reflected, while a small portion is transmitted to the diagnostic module 118. The portion of the outcoupled beam which continues past the beam splitter module 121 is the output beam 120 of the laser, which propagates toward an industrial or experimental application such as an imaging system and workpiece for photolithographic applications.

The diagnostic module 118 preferably includes at least one energy detector. This detector measures the total energy of the beam portion that corresponds directly to the energy of the output beam 120 (see U.S. Pat. Nos. 4,611,270 and 6,212,214 which are hereby incorporated by reference). An optical configuration such as an optical attenuator, e.g., a plate or a coating, or other optics may be formed on or near the detector or beam splitter module 121 to control the intensity, spectral distribution and/or other parameters of the radiation impinging upon the detector (see U.S. patent applications Ser. Nos. 09/172,805, 09/741,465, 09/712,877, 09/771,013 and 09/771,366, each of which is assigned to the same assignee as the present application and is hereby incorporated by reference).

One other component of the diagnostic module 118 is preferably a wavelength and/or bandwidth detection component such as a monitor etalon or grating spectrometer, and a hollow cathode lamp or reference light source for providing absolute wavelength calibration of the monitor etalon or grating spectrometer (see U.S. patent applications Ser. Nos. 09/416,344, 09/686,483, and 09/791,431, each of which is assigned to the same assignee as the present application, and U.S. Pat. Nos. 4,905,243, 5,978,391, 5,450,207, 4,926,428, 5,748,346, 5,025,445, 6,160,832, 6,160,831, 6,269,110, 6,272,158 and 5,978,394, all of the above wavelength and/or bandwidth detection and monitoring components being hereby incorporated by reference). The bandwidth and/or wavelength or other spectral, energy or other beam parameter may be monitored and controlled in a feedback loop including the processor 116 and optics control modules 110, 112, gas handling module 106, power supply and pulser modules 103, 104, or other laser system component modules. For example, the total pressure of the gas mixture in the laser tube 102 may be controlled to a particular value for producing an output beam at a particular bandwidth and/or energy.

Other components of the diagnostic module may include a pulse shape detector or ASE detector, such as are described at U.S. Pat. Nos. 6,243,405 and 6,243,406 and U.S. patent application Ser. No. 09/842,281, which is assigned to the same assignee as the present application, each of which are hereby incorporated by reference, such as for gas control and/or output beam energy stabilization, or to monitor the amount of amplified spontaneous emission (ASE) within the beam to ensure that the ASE remains below a predetermined level. There may be a beam alignment monitor, e.g., such as is described at U.S. Pat. No. 6,014,206, or beam profile monitor, e.g., U.S. patent application Ser. No. 09/780,124, which is assigned to the same assignee, wherein each of these patent documents is hereby incorporated by reference.

BEAM PATH ENCLOSURE

Particularly for the molecular fluorine laser system, and also for the ArF and KrF laser systems, an enclosure (not shown) preferably seals the beam path of the beam 120 such as to keep the beam path free of photoabsorbing or other contaminant species that can tend to attenuate and/or otherwise disturb the beam such as by providing a varying refractive index along the optical path of the beam. Smaller enclosures preferably seal the beam path between the chamber 102 and the optics modules 110 and 112 and between the beam splitter 122 and the diagnostic module 118 (see the Ser. Nos. 09/317,695, 09/594,892 and 09/598,552 applications, incorporated by reference above). The optics modules 110 and 112 are maintained in an atmosphere that is sufficiently evacuated or have an inert gas purged atmosphere. Preferred enclosures are described in detail in U.S. patent applications Ser. Nos. 09/598,552, 09/594,892, 09/727,600, 09/317,695 and 09/131,580, which are assigned to the same assignee and are hereby incorporated by reference, and U.S. Pat. Nos. 6,219,368, 5,559,584, 5,221, 823, 5,763,855, 5,811,753 and 4,616,908, all of which are hereby incorporated by reference.

GAS MIXTURE

The laser gas mixture is initially filled into the laser chamber 102 in a process referred to herein as a "new fills". In such procedure, the laser tube is evacuated of laser gases and contaminants, and re-filled with an ideal gas composition of fresh gas. The gas composition for a very stable excimer or molecular fluorine laser in accord with the preferred embodiment uses helium or neon or a mixture of helium and neon as buffer gas(es), depending on the particular laser being used. Preferred gas compositions are described at U.S. Pat. Nos. 4,393,405, 6,157,162, 6,243,406 and 4,977,573 and U.S. patent applications Ser. Nos. 09/513, 025, 09/447,882, 09/789,120 and 09/588,561, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas or otherwise, may be added for increased energy stability, overshoot control and/or as an attenuator as described in the Ser. No. 09/513,025 application incorporated by reference above. Specifically, for the $F_2$-laser, an addition of xenon, krypton and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%. Gas replenishment actions are described below for gas mixture compositions of systems such as ArF, KrF, and XeCl excimer lasers and molecular fluorine lasers, wherein the ideas set forth herein may be advantageously incorporated into any of these systems, and other gas discharge laser systems.

GAS REPLENISHMENT

Halogen gas injections, including micro-halogen injections of, e.g., 1–3 milliliters of halogen gas, mixed with, e.g., 20–60 milliliters of buffer gas or a mixture of the halogen gas, the buffer gas and a active rare gas for rare gas-halide excimer lasers, per injection for a total gas volume in the laser tube 102 of, e.g., 100 liters, total pressure adjustments and gas replacement procedures may be performed using the gas handling module 106 preferably including a vacuum pump, a valve network and one or more gas compartments. The gas handling module 106 receives gas via gas lines connected to gas containers, tanks, canisters and/or bottles. Some preferred and alternative gas handling and/or replenishment procedures, other than as specifically described herein (see below), are described at U.S. Pat. Nos. 4,977, 573, 6,212,214, 6,243,406 and 5,396,514 and U.S. patent applications Ser. Nos. 09/447,882, 09/734,459, 09/513,025 and 09/588,561, each of which is assigned to the same assignee as the present application, and U.S. Pat. Nos. 5,978,406, 6,014,398 and 6,028,880, all of which are hereby incorporated by reference. A xenon gas or other gas additive supply may be included either internal or external to the laser system according to the '025 application, mentioned above.

Total pressure adjustments in the form of releases of gases or reduction of the total pressure within the laser tube 102 may also be performed. Total pressure adjustments may be followed by gas composition adjustments if it is determined that, e.g., other than the desired partial pressure of halogen gas is within the laser tube 102 after the total pressure adjustment. Total pressure adjustments may also be performed after gas replenishment actions, and may be performed in combination with smaller adjustments of the driving voltage to the discharge than would be made if no pressure adjustments were performed in combination.

Gas replacement procedures may be performed and may be referred to as partial, mini- or macro-gas replacement operations, or partial new fill operations, depending on the amount of gas replaced, e.g., anywhere from a few milliliters up to 50 liters or more, but less than a new fill, such as are set forth in the Ser. No. 09/734,459 application, incorporated by reference above. As an example, the gas handling unit 106 connected to the laser tube 102 either directly or through an additional valve assembly, such as may include a small compartment for regulating the amount of gas injected (see the '459 application), may include a gas line for injecting a premix A including 1% $F_2$:99%Ne or other buffer gas such as He, and another gas line for injecting a premix B including 1% rare gas:99% buffer gas, for a rare gas-halide excimer laser, wherein for a $F_2$ laser premix B is not used. Another line may be used for injecting a gas additive or gas additive premix, or a gas additive may be added to premix A, premix B or a buffer gas. Another line may be used for total pressure additions or reductions, i.e., for flowing buffer gas into the laser tube or allowing some of the gas mixture in the tube to be released, possibly accompanying halogen injections for maintaining the halogen concentration. Thus, by injecting premix A (and premix B for rare gas-halide excimer lasers) into the tube 102 via the valve assembly, the fluorine concentration in the laser tube 102 may be replenished. Then, a certain amount of gas may be released corresponding to the amount that was injected to maintain the total pressure at a selected level. Additional gas lines and/or valves may be used for injecting additional gas mixtures. New fills, partial and mini gas replacements and gas injection procedures, e.g., enhanced and ordinary microhalogen injections, such as between 1 milliliter or less and 3–10 milliliters, or more depending on the degree of stability desired, and any and all other gas replenishment actions are initiated and controlled by the processor 116 which controls valve assemblies of the gas handling unit 106 and the laser tube 102 based on various input information in a feedback loop. These gas replenishment procedures may be used in combination with gas circulation loops and/or window replacement procedures to achieve a laser system having an increased servicing interval for both the gas mixture and the laser tube windows.

LINE NARROWING

A general description of the line-narrowing features of embodiments of the laser system particularly for use with photolithographic applications is provided here, followed by a listing of patent and patent applications being incorporated by reference as describing variations and features that may be used within the scope of the preferred embodiments herein for providing an output beam with a high spectral purity or bandwidth (e.g., below 1 pm and preferably 0.6 pm or less). These exemplary embodiments may be used along with a wavefront compensating optic. For the $F_2$ laser, the optics may be used for selecting the primary line $\lambda_1$ only of multiple lines around 157 nm, or may be used to provide additional line narrowing as well as performing lineselection, or the resonator may include optics for lineselection and additional optics for line-narrowing of the selected line, and line-narrowing may be provided by controlling (i.e., reducing) the total pressure (see U.S. patent application Ser. No. 60/212,301, which is assigned to the same assignee and is hereby incorporated by reference). Line-narrowing of the broadband emission of the ArF and/or KrF lasers may be as set forth below.

Exemplary line-narrowing optics contained in the optics module 110 include a beam expander, an optional interferometric device such as an etalon or a device having a pair of opposed non-planar reflection plates such as may be described in the Ser. Nos. 09/715,803 or 60/280,398 applications, which are assigned to the same assignee as the present application and are hereby incorporated by reference, and a diffraction grating, and alternatively one or more dispersion prisms may be used, wherein the grating would produce a relatively higher degree of dispersion than the prisms although generally exhibiting somewhat lower efficiency than the dispersion prism or prisms, for a narrow band laser such as is used with a refractive or catadioptric optical lithography imaging system. As mentioned above, the front optics module may include line-narrowing optics such as may be described in any of the Ser. Nos. 09/715,803, 09/738,849, and 09/718,809 applications, each being assigned to the same assignee and hereby incorporated by reference.

Instead of having a retro-reflective grating in the rear optics module 110, the grating may be replaced with a highly reflective mirror, and a lower degree of dispersion may be produced by a dispersive prism, or a beam expander and an interferometric device such as an etalon or device having non-planar opposed plates may be used for line-selection and narrowing, or alternatively no line-narrowing or lineselection may be performed in the rear optics module 110. In the case of using an all-reflective imaging system, the laser may be configured for semi-narrow band operation such as having an output beam linewidth in excess of 0.5 pm, depending on the characteristic broadband bandwidth of the laser, such that additional line-narrowing of the selected line would not be used, either provided by optics or by reducing the total pressure in the laser tube.

The beam expander of the above exemplary linenarrowing optics of the optics module 110 preferably includes one or more prisms. The beam expander may include other beam expanding optics such as a lens assembly or a converging/diverging lens pair. The grating or a highly reflective mirror is preferably rotatable so that the wavelengths reflected into the acceptance angle of the resonator can be selected or tuned. Alternatively, the grating, or other optic or optics, or the entire line-narrowing module may be pressure tuned, such as is set forth in the Ser. No. 09/771,366 application and the U.S. Pat No. 6,154,470 patent, each of which is assigned to the same assignee and is hereby incorporated by reference. The grating may be used both for dispersing the beam for achieving narrow bandwidths and also preferably for retroreflecting the beam back toward the laser tube. Alternatively, a highly reflective mirror is positioned after the grating which receives a reflection from the grating and reflects the beam back toward the grating in a Littman configuration, or the grating may be a transmission grating. One or more dispersive prisms may also be used, and more than one etalon or other interferometric device may be used.

Depending on the type and extent of line-narrowing and/or selection and tuning that is desired, and the particular laser that the line-narrowing optics are to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, 6,081,542, 6,061,382, 6,154,470, 5,946,337, 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, and any of the patent applications mentioned above and below herein, may be consulted to obtain a line-narrowing configuration that may be used with a preferred laser system herein, and each of these patent references is each hereby incorporated by reference into the present application.

ADDITIONAL LASER SYSTEM FEATURES

Optics module 112 preferably includes means for outcoupling the beam 120, such as a partially reflective resonator reflector. The beam 120 may be otherwise outcoupled such as by an intra-resonator beam splitter or partially reflecting surface of another optical element, and the optics module 112 would in this case include a highly reflective mirror. The optics control module 114 preferably controls the optics modules 110 and 112 such as by receiving and interpreting signals from the processor 116, and initiating realignment, gas pressure adjustments in the modules 110, 112, or reconfiguration procedures (see the '353, '695, '277, '554, and '527 applications mentioned above).

The halogen concentration in the gas mixture is maintained constant during laser operation by gas replenishment actions by replenishing the amount of halogen in the laser tube for the preferred excimer or molecular fluorine laser herein, such that these gases are maintained in a same predetermined ratio as are in the laser tube 102 following a new fill procedure. In addition, gas injection actions such as μHIs as understood from the '882 application, mentioned above, may be advantageously modified into micro gas replacement procedures, such that the increase in energy of the output laser beam may be compensated by reducing the total pressure. In addition, the laser system is preferably configured for controlling the input driving voltage so that the energy of the output beam is at the predetermined desired energy. The driving voltage is preferably maintained within a small range around $HV_{opt}$, while the gas procedure operates to replenish the gases and maintain the average pulse energy or energy dose, such as by controlling an output rate of change of the gas mixture or a rate of gas flow through the laser tube 102. Advantageously, the gas procedures set forth herein permit the laser system to operate within a very small range around $HV_{opt}$, while still achieving average pulse energy control and gas replenishment, and increasing the gas mixture lifetime or time between new fills (see U.S. patent application Ser. No. 09/780,120, which is assigned to the same assignee as the present application and is hereby incorporated by reference).

In all of the above and below embodiments, the material used for any dispersive prisms, the prisms of any beam expanders, etalons or other interferometric devices, laser windows and the outcoupler is preferably one that is highly transparent at excimer or molecular fluorine laser wavelengths such as 248 nm for the KrF laser, 193 nm for the ArF laser and 157 nm for the $F_2$ laser. The materials are also capable of withstanding long-term exposure to ultraviolet light with minimal degradation effects. Examples of such materials are $CaF_2$, $MgF_2$, BaF2, LiF and $SrF_2$, and in some cases fluorine-doped quartz may be used, and for the KrF laser, fused silica may be used. Also, in all of the embodiments, many optical surfaces, particularly those of the prisms, may or may not have an anti-reflective coating on one or more optical surfaces, in order to minimize reflection losses and prolong their lifetime.

Also, the gas composition for the excimer or molecular fluorine laser in the above configurations uses either helium, neon, or a mixture of helium and neon as a buffer gas. For rare gas-halide excimer lasers, the rare gas is preferably maintained at a concentration of around 1.0% in the gas mixture. The concentration of fluorine in the gas mixture preferably ranges from 0.003% to around 1.0%, and is preferably around 0.1%. However, if the total pressure is reduced for narrowing the bandwidth, then the fluorine concentration may be higher than 0.1%, such as may be maintained between 1 and 7 mbar, and more preferably around 3–5 mbar, notwithstanding the total pressure in the tube or the percentage concentration of the halogen in the gas mixture. The addition of a trace amount of xenon, and/or argon, and /or oxygen, and/or krypton and/or other gases (see the '025 application) may be used for increasing the energy stability, burst control, and/or output energy of the laser beam. The concentration of xenon, argon, oxygen, or krypton in the mixture as a gas additive may range from 0.0001% to 0.1%, and would be preferably significantly below 0.1%. Some alternative gas configurations including trace gas additives are set forth at U.S. patent application Ser. No. 09/513,025 and U.S. Pat. No. 6,157,662, each of which is assigned to the same assignee and is hereby incorporated by reference.

A line-narrowed oscillator, e.g., a set forth above, may be followed by a power amplifier for increasing the power of the beam output by the oscillator. Preferred features of the oscillator-amplifier set-up are set forth at U.S. patent applications Ser. Nos. 09/599,130 and 60/228,184, which are assigned to the same assignee and are hereby incorporated by reference. The amplifier may be the same or a separate discharge chamber 102. An optical or electrical delay may be used to time the electrical discharge at the amplifier with the reaching of the optical pulse from the oscillator at the amplifier. With particular respect to the $F_2$-laser, a molecular fluorine laser oscillator may have an advantageous output coupler having a transmission interference maximum at $\lambda_1$ and a minimum at $\lambda_2$. A 157 nm beam is output from the output coupler and is incident at the amplifier of this embodiment to increase the power of the beam. Thus, a very narrow bandwidth beam is achieved with high suppression of the secondary line $\lambda_2$ and high power (at least several Watts to more than 10 Watts).

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The invention is therefore not limited by any of the description of the preferred embodiments.

What is claimed is:

1. A diagnostic system for monitoring a state of an excimer laser or molecular fluorine laser system, wherein a state of the laser system can be determined based on operational laser system parameters, the diagnostic system including:

an interface for coupling an external processing device with the laser system, wherein the interface provides for the transmission of electrical signals between the processing device and the laser system; and wherein the processing device is operable to (i) output requests for a first set of operational parameters to the laser system through the interface, when the laser system is in a high importance state, (ii) output requests for a second set of operational parameters to the laser system through the interface, when the laser system is in a norm al importance state, wherein the second set of operational parameters is smaller than the first set of operational parameters, (iii) output requests for a third set of operational parameters to the laser system through the interface, when the laser system is in a low importance state, wherein the third set of operational parameters is smaller than the second set of operational parameters.

* * * * *